(12) United States Patent
Koyano

(10) Patent No.: US 11,610,829 B2
(45) Date of Patent: Mar. 21, 2023

(54) HEAT-CONDUCTIVE SHEET

(71) Applicant: SEKISUI POLYMATECH CO., LTD., Saitama (JP)

(72) Inventor: Shigeru Koyano, Higashimurayama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 35 days.

(21) Appl. No.: 16/968,975

(22) PCT Filed: Feb. 14, 2019

(86) PCT No.: PCT/JP2019/005233
§ 371 (c)(1),
(2) Date: Aug. 11, 2020

(87) PCT Pub. No.: WO2019/160004
PCT Pub. Date: Aug. 22, 2019

(65) Prior Publication Data
US 2021/0057304 A1 Feb. 25, 2021

(30) Foreign Application Priority Data

Feb. 14, 2018 (JP) .............................. JP2018-024575

(51) Int. Cl.
*H01L 23/36* (2006.01)
*B32B 7/027* (2019.01)
(Continued)

(52) U.S. Cl.
CPC .............. *H01L 23/36* (2013.01); *B32B 7/027* (2019.01); *B32B 27/08* (2013.01); *B32B 27/20* (2013.01);
(Continued)

(58) Field of Classification Search
CPC . H05K 7/20; H05K 1/05; H01L 23/36; H01L 23/42; H01L 23/34; H01L 23/46;
(Continued)

(56) References Cited

U.S. PATENT DOCUMENTS 7,476,339 B2 * 1/2009 Czubarow ................ H01B 1/08
252/500
8,287,975 B2 * 10/2012 Ohta .................... H01L 23/3735
428/42.2
(Continued)

FOREIGN PATENT DOCUMENTS

CN 102971365 3/2013
CN 107225831 A * 10/2017
(Continued)

OTHER PUBLICATIONS

English Translation of JP2014148094A (Year: 2014).*
(Continued)

*Primary Examiner* — Zachary Pape
*Assistant Examiner* — Amir A Jalali
(74) *Attorney, Agent, or Firm* — Wenderoth, Lind & Ponack, L.L.P.

(57) ABSTRACT

A heat-conducting sheet comprising a first heat-conducting layer, a second heat-conducting layer, an interface, a polymer matrix, an anisotropic filler and a non-anisotropic filler, wherein: the first and second heat-conducting layers each comprise the polymer matrix, the anisotropic filler and the non-anisotropic filler, the anisotropic filler oriented in a thickness direction, the first and second heat-conducting layers are laminated via the interface, the interface comprises the polymer matrix and the non-anisotropic filler, a filling ratio of the anisotropic filler in the interface is lower than that in the first and second heat-conducting layers, and a filling ratio of the non-anisotropic filler in the interface is
(Continued)

higher than that in the first and second heat-conducting layers; and a method of producing the heat-conducting sheet.

22 Claims, 3 Drawing Sheets

(51) Int. Cl.
    *H01L 23/42*       (2006.01)
    *H01L 23/373*     (2006.01)
    *H05K 7/20*       (2006.01)
    *B32B 27/08*      (2006.01)
    *B32B 27/20*      (2006.01)

(52) U.S. Cl.
    CPC .......... *H01L 23/3737* (2013.01); *H01L 23/42* (2013.01); *H05K 7/20481* (2013.01)

(58) Field of Classification Search
    CPC ....... H01L 23/373; H01L 23/12; B32B 7/027; B32B 7/02; B32B 7/18; B32B 25/02; B32B 25/28; B32B 27/18; B32B 9/00; B29C 39/00; B29C 43/44; C08J 5/18; C08J 5/02; C08J 5/12; C08J 5/22; C09K 5/14; C08K 13/08
    See application file for complete search history.

(56) References Cited

U.S. PATENT DOCUMENTS

| | | | |
|---|---|---|---|
| 2007/0122614 A1* | 5/2007 | Peng | D01F 8/06 428/374 |
| 2013/0136895 A1 | 5/2013 | Usui et al. | |
| 2016/0082625 A1* | 3/2016 | Luukko | B29C 59/18 428/141 |
| 2016/0104657 A1* | 4/2016 | Aramaki | H01L 23/3737 257/720 |
| 2018/0016470 A1 | 1/2018 | Shinba | |
| 2018/0023904 A1* | 1/2018 | Kato | B32B 27/38 165/80.2 |
| 2019/0162491 A1* | 5/2019 | Sun | H01L 23/3733 |

FOREIGN PATENT DOCUMENTS

| | | | | |
|---|---|---|---|---|
| JP | 2003-26828 | 1/2003 | | |
| JP | 2007-269924 | 10/2007 | | |
| JP | 2007-283509 | 11/2007 | | |
| JP | 2011-231242 | 11/2011 | | |
| JP | 2012-253167 | 12/2012 | | |
| JP | 2014-148094 | 8/2014 | | |
| JP | 2016-506 | 1/2016 | | |
| JP | 2017193109 A * | 10/2017 | ............ | B32B 27/20 |
| TW | 200846187 | 12/2008 | | |
| TW | 201704396 | 2/2017 | | |
| WO | WO-2011158942 A1 * | 12/2011 | ............ | H01L 24/27 |
| WO | WO-2012017967 A1 * | 2/2012 | ............ | H05K 3/022 |
| WO | WO-2015133274 A1 * | 9/2015 | ......... | H01L 21/4803 |
| WO | 2016/158268 | 10/2016 | | |
| WO | 2016/208458 | 12/2016 | | |
| WO | WO-2016190415 A1 * | 12/2016 | ............... | G02B 1/14 |
| WO | WO-2017110614 A1 * | 6/2017 | ............ | H01L 23/36 |
| WO | WO-2018043683 A1 * | 3/2018 | ............... | H05K 3/38 |
| WO | WO-2019160004 A1 * | 8/2019 | ............ | B32B 25/20 |

OTHER PUBLICATIONS

English Translation of JP2011231242A (Year: 2011).*
English Translation of WO2016190415A (Year: 2016).*
International Search Report (ISR) dated May 7, 2019 in corresponding International (PCT) Application No. PCT/JP2019/005233.

* cited by examiner

HEAT-CONDUCTIVE SHEET

TECHNICAL FIELD

The present invention relates to a heat-conducting sheet, for example, a heat-conducting sheet used by arranging between a heat-generating element and a heat-dissipating element.

BACKGROUND ART

In electronic devices such as computers, automobile parts, and mobile phones, a heat-dissipating element such as a heat sink is commonly used to dissipate heat generated from a heat-generating element, such as a semiconductor element or a mechanical part. It is known to arrange a heat-conducting sheet between the heat-generating element and the heat-dissipating element in order to increase the efficiency of heat transfer to the heat-dissipating element.

The heat-conducting sheet is commonly used by compressing it when it is arranged inside the electronic device, and thus high flexibility is required. Therefore, the heat-conducting sheet may be formed by mixing a filler having thermal conduction properties with a polymer matrix having high flexibility, such as rubber or a gel. Further, it is widely known that to increase the thermal conduction properties of the heat-conducting sheet in the thickness direction, a filler having anisotropy, such as carbon fibers, is oriented in the thickness direction.

Various attempts have previously been made to increase the thermal conduction properties of a heat-conducting sheet. For example, as disclosed in Patent Literature 1 to 3, it is known to cause carbon fibers oriented in the thickness direction to be exposed or protrude from the surface.

Further, while the heat-conducting sheet may be fixed to an adherend surface, it may also be slid or the like when attaching to an electronic device. Therefore, it is also known to make one surface a pressure-sensitive adhesive surface and the other surface a non-pressure-sensitive adhesive surface. For example, Patent Literature 1 discloses producing a formed sheet containing carbon fibers oriented in the thickness direction with a forming mold, and cutting the formed sheet into two along the plane direction to obtain a heat-conducting sheet in which the molding surface is a pressure-sensitive adhesive surface and the cut surface is a non-pressure-sensitive adhesive surface.

In addition, conventionally, a heat-conducting sheet may have a multi-layer structure in order to impart various functions. For example, Patent Literature 2 describes attempting to form a laminated body by stacking a plurality of heat-conducting members in which carbon fibers are exposed on both surfaces. In Patent Literature 2, because the exposed carbon fibers are connected between the layers, thermal conduction properties in the thickness direction are secured even in the laminated body.

Further, Patent Literature 3 discloses a heat-conducting sheet obtained by laminating an electrically insulative heat-conducting layer containing a heat-conducting filler having electrical insulation properties, which is formed of spherical aluminum oxide or the like, on a carbon-fiber-oriented heat-conducting layer including carbon fibers oriented in the thickness direction. The heat-conducting sheet disclosed in Patent Literature 3 includes the electrically insulative heat-conducting layer, which increases electrical insulation properties in the thickness direction while having good thermal conduction properties in the thickness direction, thereby enabling the sheet to be used in a wide range of applications.

CITATION LIST

Patent Literature

PTL 1: JP 2011-231242 A
PTL 2: JP 2016-000506 A
PTL 3: WO 2016/208458 A

SUMMARY OF INVENTION

Technical Problem

However, when heat-conducting members having exposed carbon fibers are laminated as in Patent Literature 2, although excellent thermal conduction properties are secured, problems tends to arise, such as the carbon fibers inhibiting adhesion between layers, a large number of bubbles being formed between the layers, and the heat-conducting members not sufficiently adhering to each other. Further, in the laminated structure disclosed in Patent Literature 2, since many carbon fibers are connected between layers, electrical insulation properties in the thickness direction cannot be secured, and the structure can be used only in limited applications in electronic devices.

On the other hand, in Patent Literature 3, although electrical insulation properties in the thickness direction are secured while maintaining certain thermal conduction properties, in recent years, due to the reduced size of electronic devices, for example, heat-conducting sheets need to have even better thermal conduction properties.

Therefore, a problem of the present invention is to provide a heat-conducting sheet capable of achieving good adhesion between the layers while securing thermal conduction properties in the thickness direction when heat-conducting layers in which an anisotropic filler is oriented in the thickness direction are formed into a laminated structure. Further, another problem of the present invention is to provide a heat-conducting sheet having excellent thermal conduction properties while securing electrical insulation properties.

Solution to Problem

As a result of diligent studies, the present inventor found that when heat-conducting layers in which an anisotropic filler is oriented in the thickness direction are formed into a laminated structure, the above-described problems can be solved by providing an interface having a lower anisotropic filler filling ratio than that in the heat-conducting layer, thereby completing the present invention described below.

That is, the present invention provides the following [1] to [15].

[1] A heat-conducting sheet comprising a first heat-conducting layer and a second heat-conducting layer, the first and second heat-conducting layers each comprising a polymer matrix and an anisotropic filler, the anisotropic filler oriented in a thickness direction, wherein
 the first and second heat-conducting layers are laminated via an interface,
 the interface comprises the polymer matrix, and a filling ratio of the anisotropic filler in the interface is lower than that in the first and second heat-conducting layers.
[2] The heat-conducting sheet according to [1], further comprising a non-anisotropic filler.

[3] The heat-conducting sheet according to [2], wherein the non-anisotropic filler is contained in the first and second heat-conducting layers and in the interface, and a filling ratio of the non-anisotropic filler in the interface is higher than that in the first and second heat-conducting layers.

[4] The heat-conducting sheet according to [2] or [3], wherein the non-anisotropic filler has electrical insulation properties.

[5] The heat-conducting sheet according to any one of [1] to [4], wherein the anisotropic filler has electrical conductivity.

[6] The heat-conducting sheet according to any one of [1] to [5], wherein the anisotropic filler is graphitized carbon fiber.

[7] The heat-conducting sheet according to any one of [1] to [6], wherein
an end portion on the second heat-conducting layer side of the anisotropic filler contained in the first heat-conducting layer and an end portion on the first heat-conducting layer side of the anisotropic filler contained in the second heat-conducting layer face each other, and
the anisotropic filler contained in the first heat-conducting layer and the anisotropic filler contained in the second heat-conducting layer do not substantially intersect with each other.

[8] The heat-conducting sheet according to any of [1] to [7], wherein on a surface on the first heat-conducting layer side of the heat-conducting sheet, the anisotropic filler protrudes from the polymer matrix, and on a surface on the second heat-conducting layer side of the heat-conducting sheet, the anisotropic filler does not protrude from the polymer matrix.

[9] The heat-conducting sheet according to any of [1] to [8], wherein the surface on the first heat-conducting layer side of the heat-conducting sheet has a lower friction coefficient than the surface on the second heat-conducting layer side of the heat-conducting sheet.

[10] The heat-conducting sheet according to [9], wherein the surface on the first heat-conducting layer side of the heat-conducting sheet has a friction coefficient of less than 0.3, and the surface on the second heat-conducting layer side of the heat-conducting sheet has a friction coefficient of 0.3 or more.

[11] The heat-conducting sheet according to any one of [1] to [10], wherein the interface has a thickness of 60 μm or less.

[12] A method for producing a heat-conducting sheet comprising:
providing a first sheet and a second sheet each comprising a polymer matrix and an anisotropic filler, the anisotropic filler oriented in a thickness direction therein; and
laminating the first and second sheets so that one surface of the first sheet and one surface of the second sheet are in contact with each other to obtain a heat-conducting sheet, wherein
at least the one surface of the second sheet is formed from a skin layer in which a filling ratio of the anisotropic filler is smaller than that in other portions of the second sheet.

[13] The method for producing the heat-conducting sheet according to [12], wherein the one surface of the second sheet has pressure-sensitive adhesive properties.

[14] The method for producing the heat-conducting sheet according to [12] or [13], wherein at least one of the one surface of the first sheet and the one surface of the second sheet has a surface roughness Ra of 4 μm or less.

[15] The method for producing the heat-conducting sheet according to [14], wherein the one surface of the first sheet has anisotropic filler protruding from the polymer matrix and a surface roughness Ra of 4 μm or less.

Advantageous Effects of Invention

According to the present invention, even when a heat-conducting sheet is formed as a laminated structure, by providing an interface having a lower anisotropic filler filling ratio than the heat-conducting layers, good adhesion between layers can be achieved while securing thermal conduction properties in the thickness direction.

Further, in the present invention, a heat-conducting sheet can be provided having excellent thermal conduction properties while securing electrical insulation properties by containing a non-anisotropic filler having electrical insulation properties in the heat-conducting sheet and increasing the filling ratio of the non-anisotropic filler in the interface compared with the heat-conducting layer.

DESCRIPTION OF EMBODIMENTS

A heat-conducting sheet according to embodiments of the present invention will now be described in detail below.

First Embodiment

Figure 1:
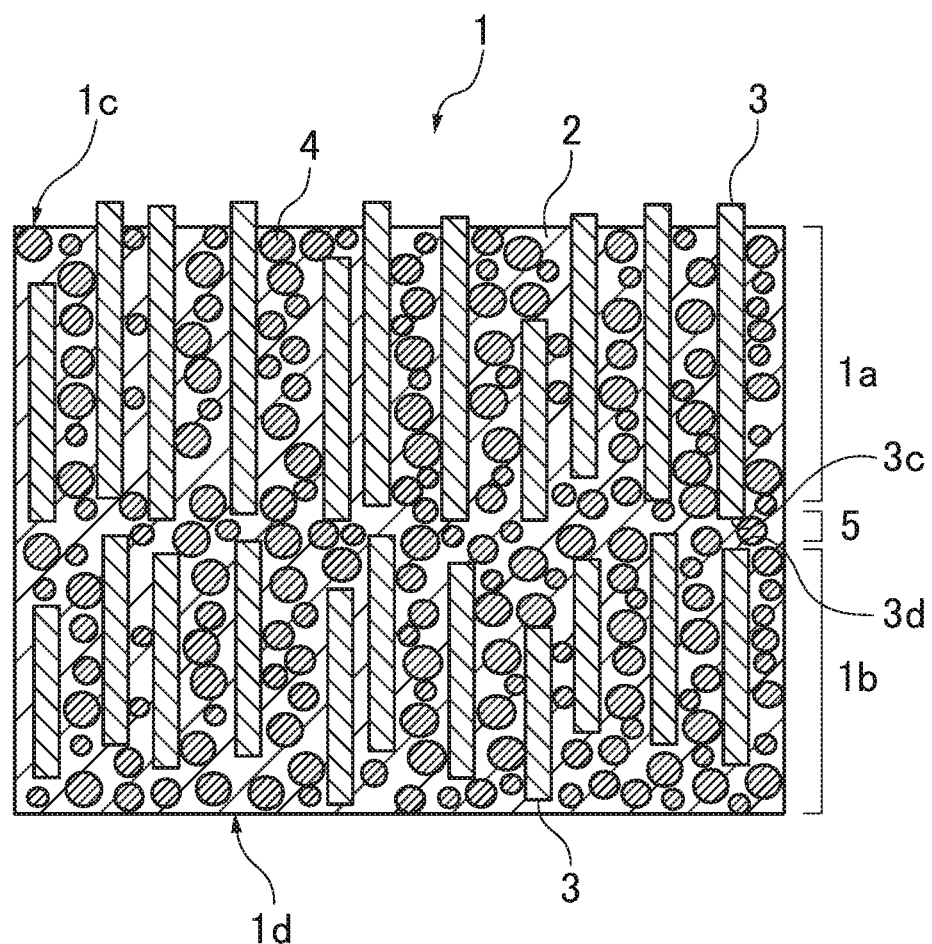
FIG. 1 is a schematic cross-sectional view illustrating a heat-conducting sheet according to a first embodiment.

FIG. 1 illustrates a heat-conducting sheet according to a first embodiment. A heat-conducting sheet 1 according to the first embodiment comprises a first heat-conducting layer 1a and a second heat-conducting layer 1b, which each comprise a polymer matrix 2 and an anisotropic filler 3. The anisotropic filler 3 is oriented in a thickness direction, and the first and second heat-conducting layers 1a and 1b are laminated via an interface 5. The interface 5 includes the polymer matrix 2, and the filling ratio of the anisotropic filler 3 in the interface 5 is lower than that in the first and second heat-conducting layers 1a and 1b.

In this way, in the heat-conducting sheet 1 of the present invention, the first and second heat-conducting layers 1a and 1b are laminated via the interface 5 having the low filling ratio of the anisotropic filler 3, which enables better adhesion between the layers to be achieved while ensuring thermal conduction properties in the thickness direction.

The heat-conducting sheet 1 further contains a non-anisotropic filler 4. The heat-conducting sheet 1 has better thermal conduction properties as a result of containing the non-anisotropic filler 4. The non-anisotropic filler 4 is contained in the first and second heat-conducting layers 1a and 1b and in the interface 5. Further, in the heat-conducting sheet 1, it is preferable that the anisotropic filler 3 have electrical conductivity but that the non-anisotropic filler 4 have electrical insulation properties. In the present invention, "have electrical conductivity" means, for example, having a volume resistivity of $1 \times 10^9$ Ω·cm or less. Moreover, "have electrical insulation properties" means, for example, having a volume resistivity exceeding $1\times10^9$ $\Omega\cdot cm$.

In the present embodiment, the filling ratio of the non-anisotropic filler 4 in the interface 5 is higher than the filling ratio of the non-anisotropic filler 4 in the first and second heat-conducting layers 1a and 1b. Therefore, the heat-conducting sheet 1 is electrically shielded by the non-anisotropic filler 4 present in the interface 5, and thus the electrical insulation properties in the thickness direction can be increased. As a result, the heat-conducting sheet 1 can be used for various applications.

Further, as described above, in the interface 5, although the filling ratio of the anisotropic filler 3 is lower, because heat is conducted by the non-anisotropic filler 4, the thermal conduction properties in the thickness direction of the heat-conducting sheet 1 are excellent.

Next, each member constituting the heat-conducting sheet will be described in detail.

<Polymer Matrix>

The polymer matrix 2 used in the heat-conducting sheet 1 is a polymer compound such as an elastomer or rubber. It is preferable to use a polymer compound formed by curing a liquid polymer composition (curable polymer composition) composed of a mixed system such as a base resin and a curing agent. The curable polymer composition may be composed of, for example, an uncrosslinked rubber and a crosslinking agent, or may include a monomer, a prepolymer or the like and a curing agent or the like. Further, the curing reaction may be room temperature curing or heat curing.

An example of the polymer matrix formed from the curable polymer composition is a silicone rubber. When the polymer matrix is a silicone rubber, as the curable polymer composition, for example, an addition-reaction-type composition may be used. More specifically, a curable polymer composition including an alkenyl group-containing organopolysiloxane and an organohydrogenpolysiloxane can be used.

As the rubber, various synthetic rubbers other than the above can be used. Specific examples thereof include acrylic rubber, nitrile rubber, isoprene rubber, urethane rubber, ethylene propylene rubber, styrene-butadiene rubber, butadiene rubber, fluororubber, butyl rubber, and the like. When these rubbers are used, the synthetic rubber may be crosslinked or may remain uncrosslinked (that is, uncured) in the heat-conducting sheet 1. Uncrosslinked rubber is mainly used in flow orientation.

Further, when the synthetic rubber is to be crosslinked (that is, cured), as described above, the polymer matrix may be obtained by curing a curable polymer composition composed of an uncrosslinked rubber of the synthetic rubber described above and a crosslinking agent.

In addition, as the elastomer, a thermoplastic elastomer such as a polyester thermoplastic elastomer or a polyurethane thermoplastic elastomer, or a thermosetting elastomer formed by curing a mixed liquid polymer composition composed of a base resin and a curing agent may be used. Examples thereof include a polyurethane elastomer formed by curing a polymer composition containing a polymer having a hydroxyl group, and an isocyanate.

Among the above, for example, it is preferable to use a silicone rubber, particularly an addition-reaction-type silicone rubber, since the polymer matrix after curing is particularly flexible and the filling properties of a thermally conductive filler are good.

The polymer composition for forming the polymer matrix may be composed of a polymer compound alone, or may be composed of a polymer compound and a plasticizer. The plasticizer is preferably used when a synthetic rubber is used. By including the plasticizer, the flexibility of the polymer matrix when it is not crosslinking is increased and adhesion is improved.

The plasticizer to be used is compatible with the polymer compound. Specifically, ester plasticizer or silicone oil is preferable. Specific examples of ester plasticizers include phthalic acid ester, adipic acid ester, trimellitic acid ester, phosphoric acid ester, sebacic acid ester, azelaic acid ester, maleic acid ester, benzoic acid ester, and the like. Examples of silicone oils include polydimethylsiloxane.

The content of the plasticizer with respect to the polymer compound is, in terms the mass ratio of plasticizer/polymer compound, preferably 20/80 to 60/40, and more preferably 30/70 to 55/45. By setting the mass ratio of the plasticizer/polymer compound to 60/40 or less, the filler can be held more easily by the polymer compound. Further, by setting this mass ratio to 20/80 or more, the flexibility of the polymer matrix is sufficient and the adhesion of the first and second heat-conducting layers tends to increase. The plasticizer is preferably used when orienting the anisotropic filler by the flow orientation described later.

The content of the polymer matrix is, when expressed in terms of % by volume, with respect to the total amount of the heat-conducting sheet, preferably 20 to 50% by volume, and more preferably 30 to 45% by volume.

<Anisotropic Filler>

The anisotropic filler 3 added in the polymer matrix 2 is a filler that has an anisotropic shape and that can be oriented. Examples of the anisotropic filler 3 include fibrous materials and flake-like materials. The anisotropic filler 3 generally has a high aspect ratio, and preferably has an aspect ratio of more than 2, and more preferably 5 or more. When the aspect ratio is larger than 2, the anisotropic filler 3 is easily oriented in the thickness direction, and tends to increase the thermal conduction properties of the heat-conducting sheet 1.

The upper limit of the aspect ratio is not particularly limited, but in practical terms it is 100.

It is noted that the "aspect ratio" is the ratio of the length in the major axis direction to the length in the minor axis direction of the anisotropic filler 3. For a fibrous material, aspect ratio means fiber length/diameter of the fiber, and for a flake-like material, aspect ratio means length/thickness in the major axis direction of the flake-like material.

The anisotropic filler 3 is preferably a fibrous material from the viewpoint of increasing the thermal conduction properties and easily obtaining the effect of providing the interface 5.

The content of anisotropic filler 3 in the heat-conducting sheet is, with respect to 100 parts by mass of the polymer matrix, preferably 75 to 250 parts by mass, and more preferably 100 to 200 parts by mass. Further, the content of anisotropic filler 3 is, when expressed in terms of % by volume, with respect to the total amount of the heat-conducting sheet, preferably 10 to 35% by volume, and more preferably 13 to 30% by volume.

By setting the content of the anisotropic filler 3 to 75 parts by mass or more, thermal conduction properties tend to increase, and by setting the content to 150 parts by mass or less, the viscosity of the mixed composition described later tends to be appropriate, and the orientation of the anisotropic filler 3 is good.

When the anisotropic filler 3 is fibrous, the average fiber length thereof is preferably 10 to 500 µm, and more preferably 20 to 200 µm. When the average fiber length is 10 µm or more, the anisotropic filler particles appropriately contact each other in each of the heat-conducting layers 1a and 1b, a heat transfer path is secured, and the thermal conduction properties of the heat-conducting sheet 1 are good.

On the other hand, when the average fiber length is 500 μm or less, the anisotropic filler has a reduced bulk and can be densely packed in the polymer matrix. Further, the electrical conductivity of the heat-conducting sheet can be prevented from increasing more than necessary.

The average fiber length can be calculated by observing the anisotropic filler with a microscope. More specifically, for example, the fiber length of 50 arbitrary anisotropic filler fibers is measured with an electron microscope or an optical microscope, and the average value (arithmetic mean value) thereof is taken as the average fiber length.

In each of the first and second heat-conducting layers 1a and 1b, the average fiber length of the fibrous material is preferably shorter than the thickness of each of the first and second heat-conducting layers 1a and 1b. By setting the average fiber length to be shorter than the thicknesses of the first and second heat-conducting layers 1a and 1b, the anisotropic filler 3 is unevenly distributed in the first and second heat-conducting layers 1a and 1b, and as a result the filling ratio of the anisotropic filler 3 in the interface 5 between the first and second heat-conducting layers 1a and 1b tends to be lower.

Further, in each of the first and second heat-conducting layers 1a and 1b, it is preferable that the fibrous material has an average fiber length that is 80% or less of the thickness of each of the first and second heat-conducting layers 1a and 1b and the content of the fibrous material having a fiber length of more than 90% of the thickness of each of the first and second heat-conducting layers 1a and 1b is 5% by mass or less with respect to the fibrous material contained in each of the layers 1a and 1b. With such a mode, when the heat-conducting sheet 1 is compressed, the fibrous material is prevented from having a length exceeding its compressed thickness. Therefore, the fibrous material is less likely to pass through the interface and penetrate from one heat-conducting layer to another heat-conducting layer even during use, and the electrical insulation properties in the thickness direction tend to be secured.

In addition, in each of the first and second heat-conducting layers 1a and 1b, it is preferable that the fibrous material includes a fibrous material having a fiber length of 50% or less of the thickness of each of the first and second heat-conducting layers 1a and 1b. By including a fibrous material having such a fiber length in each heat-conducting layer, the fibrous material tends to be distributed more uniformly.

Still further, from the viewpoint of reducing the amount of fibrous material that passing through the interface 5 or intersecting with each other in the interface 5, the fibrous material preferably has a narrow particle size distribution. On the other hand, from the viewpoint that thermal conductivity can be increased, a plurality of fibrous materials having different particle size distributions may be mixed and used.

Further, when the anisotropic filler 3 is a flake-like material, its average particle size is preferably 10 to 400 μm, more preferably 15 to 300 μm. Moreover, 20 to 200 μm is particularly preferable. By setting the average particle size to 10 μm or more, the anisotropic fillers 3 are more likely to come into contact with each other in the heat-conducting layers 1a and 1b, a heat transfer path is secured, and the thermal conduction properties of the heat-conducting sheet 1 are good. On the other hand, by setting the average particle size to 400 μm or less, the anisotropic filler 3 has a reduced bulk and can be densely packed in the polymer matrix 2.

It is noted that the average particle size of the flake-like material can be calculated by observing the anisotropic filler with a microscope and taking the major axis as the diameter. More specifically, for example, the diameter of 50 arbitrary anisotropic filler particles is measured with an electron microscope or an optical microscope, and the average value (arithmetic mean value) thereof is taken as the average fiber length.

As the anisotropic filler 3, a known material having thermal conduction properties may be used, and a material having electrical conductivity is generally used. Further, as described later, it is preferable that the anisotropic filler 3 have diamagnetism so that it can be oriented in the magnetic field.

Specific examples of the anisotropic filler 3 include carbonaceous materials represented by carbon fibers and flake-like carbon powder, metal materials represented by metal fibers, and metal oxides, boron nitride and metal nitrides, metal carbides, metal hydroxides, and the like. Among these, carbonaceous materials are preferable because they have a low specific gravity and good dispersibility in the polymer matrix 2, and among them, graphitized carbon material is more preferable due to having high thermal conductivity. Graphitized carbon material has anisotropic diamagnetic susceptibility by aligning the graphite planes in a predetermined direction. Further, boron nitride and the like also have anisotropic diamagnetic susceptibility by aligning the crystal planes in a predetermined direction.

Therefore, from the viewpoint that orientation in arbitrary direction by magnetic field orientation is possible, flake-like boron nitride or graphitized carbon material is preferable due to having anisotropic diamagnetic susceptibility as described above.

Here, anisotropic diamagnetic susceptibility is a physical property value (CGS unit system) indicating the anisotropy of the diamagnetic susceptibility of the anisotropic filler 3. That is, this anisotropic diamagnetic susceptibility is a value for the magnetic susceptibility of the anisotropic filler 3, which is generated by applying an external magnetic field, obtained by, for example, subtracting the magnetic susceptibility of the perpendicular direction from that of the fiber axis direction or the in-plane direction of the flake plane. This anisotropic diamagnetic susceptibility can be measured by a known method such as using a magnetic anisotropy torque meter, a vibrating magnetometer, or a superconducting quantum interference device (SQUID), or a suspension method or the like.

The thermal conductivity along the anisotropic direction (that is, the major axis direction) of the anisotropic filler 3 is not particularly limited, and is generally 60 W/m·K or more, and preferably 400 W/m·K or more. The thermal conductivity of the anisotropic filler 3 is 2000 W/m·K or less, for example, although the upper limit thereof is not particularly limited. The measurement method of the thermal conductivity is a laser flash method.

The anisotropic filler 3 may be used alone or in combinations of two or more kinds. For example, as the anisotropic filler 3, at least two anisotropic fillers 3 having different average particle sizes or average fiber lengths may be used. When anisotropic fillers of different sizes are used, it is thought that the small anisotropic filler intercalates among the relatively large anisotropic filler, so that the anisotropic fillers can be densely packed in the polymer matrix and the heat transfer efficiency can be improved.

The carbon fiber used as the anisotropic filler 3 is preferably graphitized carbon fiber. Further, as the flake-like carbon powder, a flaked graphite powder is preferable. Among these, the anisotropic filler 3 is more preferably graphitized carbon fiber.

Graphitized carbon fiber has a high thermal conductivity in the fiber axis direction due to the fact that the crystal planes of the graphite are continuous in the fiber axis direction. Therefore, the thermal conductivity in a specific direction can be increased by aligning the axis direction of those fibers in a predetermined direction. Further, a flaked carbon powder has a high thermal conductivity in the plane direction due to the fact that the crystal planes of the graphite are continuous in the plane direction of the flake-like planes. Therefore, the thermal conductivity in a specific direction can be increased by aligning those flake-like planes in a predetermined direction. The graphitized carbon fiber and flaked graphite powder preferably have a high degree of graphitization.

The above-described graphitized carbon material such as graphitized carbon fiber and flake-like graphite powder can be obtained by graphitizing the following raw materials. Examples thereof include fused polycyclic hydrocarbon compounds such as naphthalene, polyacrylonitrile (PAN), fused heterocyclic compounds such as pitch, and the like. In particular, it is preferable to use a graphitized mesophase pitch having a particularly high degree of graphitization, a polyimide, or a polybenzazole. For example, when mesophase pitch is used, in the spinning step described below, the pitch becomes oriented in the fiber axis direction due to its anisotropy, and graphitized carbon fiber having excellent thermal conduction properties in the fiber axis direction can be obtained.

The way the mesophase pitch is used in the graphitized carbon fiber is not particularly limited as long as the graphitized carbon fiber can be spun, and the mesophase pitch may be used alone or in combination with other raw materials. However, the use of mesophase pitch alone, that is, the use of graphitized carbon fiber having a mesophase pitch content of 100%, is most preferable in terms of increasing thermal conduction properties, spinnability and quality stability.

As the graphitized carbon fiber, fiber obtained by sequentially performing the processes of spinning, infusibilizing, and carbonizing, pulverizing or cutting the resulting product to a particular particle size, and then graphitizing the resulting product, or fiber obtained by carbonizing, then pulverizing or cutting, and then graphitizing, may be used. When pulverizing or cutting is performed before graphitizing, a polycondensation reaction and a cyclization reaction tend to proceed smoothly during the graphitizing process on the surfaces that have been newly exposed by the pulverizing, and thus the degree of graphitization can be increased and graphitized carbon fiber having even better thermal conduction properties can be obtained. On the other hand, when the spun carbon fibers are graphitized and then pulverized, the carbon fibers after graphitization are stiff and thus are easy to pulverize, and hence a carbon fiber powder having a relatively narrow fiber length distribution can be obtained by performing pulverization for a short period of time.

The fiber diameter of the graphitized carbon fiber is not particularly limited, and is preferably 5 to 20 μm. When the fiber diameter is in the range of 5 to 20 μm, industrial production is smooth and the thermal conduction properties of the obtained heat-conducting sheet can be increased.

The average fiber length of the graphitized carbon fiber is, as described above, preferably 10 to 500 μm, and more preferably 20 to 200 μm. Further, as described above, the aspect ratio of the graphitized carbon fiber is preferably more than 2, and more preferably 5 or more.

The thermal conductivity of the graphitized carbon fiber is not particularly limited, and the thermal conductivity in the fiber axis direction is preferably 400 W/m·K or more, and more preferably 800 W/m~K or more.

The anisotropic filler 3 is oriented in the thickness direction in each heat-conducting layer. More specifically, the anisotropic filler 3 is oriented in the thickness direction such that the ratio of the number of carbon fiber powders having an angle between the fiber axis and the thickness direction of the heat-conducting sheet 1 of less than 30° exceeds 50%.

It is noted that from the viewpoint of increasing thermal conductivity, the orientation direction of the anisotropic filler 3 is preferably such that the angle between the fiber axis and the thickness direction is 0°. On the other hand, from the viewpoint that the load when the heat-conducting sheet 1 is compressed can be reduced, the orientation direction can be inclined within a range of 5 to 30°.

Further, the anisotropic filler 3 is unevenly distributed in the first and second heat-conducting layers 1a and 1b in the thickness direction of the heat-conducting sheet 1. Here, "unevenly distributed" means that the concentration (filling ratio) of anisotropic filler 3 is uneven, and means that the interface 5 between the first and second heat-conducting layers 1a and 1b has a filling ratio of the anisotropic filler 3 that is lower than the filling ratio of the first and second heat-conducting layers 1a and 1b.

<Non-Anisotropic Filler>

The non-anisotropic filler 4 is a heat-conducting filler material contained in the heat-conducting sheet 1 separately from the anisotropic filler 3, which imparts thermal conduction properties to the heat-conducting sheet 1 together with the anisotropic filler 3. In the present embodiment, by containing the non-anisotropic filler 4, a heat-conducting sheet 1 having high thermal conductivity can be obtained in which filler material is interposed in the gaps among the oriented anisotropic filler 3.

The non-anisotropic filler 4 is a filler material having substantially no anisotropy in its shape. Even in an environment in which the anisotropic filler 3 is oriented in a predetermined direction, such as in an environment in which magnetic force lines are generated or under the action of a shearing force, which will be described later, the non-anisotropic filler 4 does not orient in that direction.

The non-anisotropic filler 4 has an aspect ratio of preferably 2 or less, and more preferably 1.5 or less. In the present embodiment, by containing a non-anisotropic filler 4 having a low aspect ratio in this manner, a heat-conducting sheet 1 having high thermal conductivity can be obtained in which filler material having thermal conduction properties is appropriately interposed in the gaps among the anisotropic filler 3. Further, by setting the aspect ratio to 2 or less, it is possible to prevent the viscosity of the mixed composition described later from increasing and to achieve dense packing.

Specific examples of the non-anisotropic filler 4 include metals, metal oxides, metal nitrides, metal carbides, metal hydroxides, and carbon materials. The non-anisotropic filler 4 may have a spherical or amorphous powder shape.

In the non-anisotropic filler 4, examples of metals include aluminum, copper, nickel, and the like, examples of metal oxides include aluminum oxide, magnesium oxide, zinc oxide, quartz, and the like, and examples of metal nitrides include boron nitride, aluminum nitride, and the like. Further, examples of metal carbides include silicon carbide, and examples of metal hydroxides includes aluminum hydroxide. In addition, examples of carbon materials include spherical graphite and the like.

Among these, aluminum oxide and aluminum are preferable because they have high thermal conductivity and it is easy to obtain spherical aluminum oxide or aluminum, and aluminum hydroxide is preferable because it is easily available and can increase the frame retardance of the heat-conducting sheet.

The non-anisotropic filler 4 preferably has electrical insulation properties, and specifically, it is preferable to use a metal oxide, a metal nitride, a metal hydroxide, or a metal carbide. Among them, aluminum oxide and aluminum hydroxide are more preferable. In the present embodiment, since the non-anisotropic filler 4 has electrical insulation properties, the heat-conducting sheet 1 can easily have electrical insulation properties in the thickness direction due to the interface having a high filling ratio of the non-anisotropic filler 4.

The non-anisotropic filler 4 preferably has an average particle size of 0.1 to 50 μm, and more preferably 0.5 to 35 μm. Further, the average particle size of 1 to 15 μm is particularly preferable. By setting the average particle size to 50 μm or less, problems such as disturbing the orientation of the anisotropic filler 3 are less likely to occur. Further, by setting the average particle size to 0.1 μm or more, the specific surface area of the non-anisotropic filler 4 does not become unnecessarily large, the viscosity of the mixed composition does not easily increase even if it is added in a large amount, and it is easier to pack the non-anisotropic filler 4 more densely.

The average particle size of the non-anisotropic filler 4 can be measured by observation with an electron microscope or the like. More specifically, for example, the particle size of 50 arbitrary non-anisotropic filler particles is measured with an electron microscope or an optical microscope, and the average value (arithmetic mean value) thereof is taken as the average particle size.

The content of the non-anisotropic filler 4 is, with respect to 100 parts by mass of the polymer matrix, preferably in the range of 250 to 800 parts by mass, and more preferably in the range of 350 to 700 parts by mass. When the content is 250 parts by mass or more, the amount of the non-anisotropic filler 4 interposing in the gaps among the anisotropic filler 3 is sufficient, and thermal conduction properties are good. On the other hand, when the content is 800 parts by mass or less, the effect of an increase in thermal conduction properties in accordance with the content can be obtained, and the non-anisotropic filler 4 does not hinder heat conduction by the anisotropic filler 3. Further, by setting the content in the range of 350 to 700 parts by mass, the thermal conduction properties of the heat-conducting sheet 1 are excellent, and the viscosity of the mixed composition is also suitable.

Furthermore, the content of the non-anisotropic filler 4 is, when expressed in % by volume, in terms of the total amount of the heat-conducting sheet, preferably 25 to 60% by volume, and more preferably 35 to 50% by volume.

<Interface>

As described above, the interface 5 that is a portion between the first and second heat-conducting layers 1a and 1b includes the polymer matrix 2, in which the filling ratio of the anisotropic filler 3 is lower than that in the first and second heat-conducting layers 1a and 1b.

That is, the interface 5 is formed such that the polymer matrix 2 spreads in a planar shape along the plane direction of the heat-conducting sheet 1 in a state in which there is little or no anisotropic filler 3. Therefore, the first and second heat-conducting layers 1a and 1b easily adhere to each other via the interface 5. Further, when the anisotropic filler 3 is electrically conductive, the first and second heat-conducting layers 1a and 1b are electrically separated by this interface 5, and the electrical insulation properties in the thickness direction of the heat-conducting sheet 1 are increased.

Here, the filling ratio of the anisotropic filler 3 in the interface 5 is preferably 20% or less of the filling ratio of the anisotropic filler 3 in the first and second heat-conducting layers 1a and 1b.

The filling ratio of the anisotropic filler can be calculated based on the number of particles of the anisotropic filler 3 on a line having a predetermined length (400 μm) drawn perpendicular to the thickness direction. Further, the filling ratio at a center position in the thickness direction of the first and second heat-conducting layers 1a and 1b may be taken as the filling ratio in each of the first and second heat-conducting layers 1a and 1b.

Specifically, in a cross-section of the heat-conducting sheet 1, when a 400 μm line is drawn perpendicular to the thickness direction at the center position in the thickness direction of the first heat-conducting layer 1a, with a line where the number of particles of the anisotropic filler 3 on such a line having the same length as the 400 μm line at the vicinity of the interface on the first heat-conducting layer 1a side is 20% with respect to the number of particles of the anisotropic fillers 3 on the 400 μm line being taken as a first boundary line, a region having the filling ratio that is 20% or less means the region outside the boundary line in which the ratio of anisotropic filler 3 is 20% or less. This also means, when a 400 μm line is similarly drawn perpendicular to the thickness direction at the center position in the thickness direction of the second heat-conducting layer 1b, with a line where the number of particles of the anisotropic filler 3 on such a line having the same length as the 400 μm line at the vicinity of the interface on the second heat-conducting layer 1b side is 20% with respect to the number of particles of the anisotropic filler 3 on the 400 μm line being taken as a second boundary line, the region outside the boundary line in which the ratio of anisotropic filler 3 is 20% or less. It is noted that the first and second boundary lines are perpendicular lines in the thickness direction.

The interface 5 preferably comprises a region sandwiched between the first boundary line and the second boundary line thus obtained. In addition, within the region in which the ratio of anisotropic filler 3 is 20% or less, it is preferable to have a region sandwiched between boundary lines in which the ratio of the anisotropic filler 3 is 10% or less, more preferably 5%, and further preferably 1% or less.

As illustrated in FIG. 1, it can be also said that the interface 5 is a portion where an end portion (hereinafter, also simply referred to as "lower end") 3c on the second heat-conducting layer 1b side of the anisotropic filler 3 contained in the first heat-conducting layer 1a faces an end portion (hereinafter, also simply referred to as "upper end") 3d on the first heat-conducting layer 1a side of the anisotropic filler 3 contained in the second heat-conducting layer 1b. Since these end portions 3c and 3d of the anisotropic filler 3 face each other in such a way, the heat-conducting sheet 1 can maintain high thermal conduction properties without almost any reduction in thermal conduction properties.

Moreover, the anisotropic filler 3 contained in the second heat-conducting layer 1b and the anisotropic filler 3 contained in the first heat-conducting layer 1a do not substantially intersect with each other. Since the anisotropic filler 3 does not substantially intersect, the filling ratio of the anisotropic filler 3 in the interface 5 can be sufficiently reduced.

Here, "substantially not intersect" means that there is no intersection except for inevitable intersections arising during production. Specifically, "substantially not intersect" means, when, in the cross-section of the heat-conducting sheet 1, a 400 μm line perpendicular to the thickness direction is drawn at the center position in the thickness direction of each of the first and second heat-conducting layers 1a and 1b, the number of particles of the anisotropic filler 3 (A1, A2) on each line is calculated, and then the total value (A1+A2) is calculated, the number of intersecting particles of anisotropic filler 3 on a line having the same length as the 400 μm lines is sufficiently small with respect to the total value; more specifically, the ratio of the number of intersecting particles of the anisotropic filler 3 is 20% or less, preferably 10% or less, more preferably 1% or less, and most preferably 0%. The "number of intersecting particles of the anisotropic filler 3" refers to, when the 400 μm line perpendicular to the thickness direction in the interface 5 is drawn, a value obtained by summing the number of particles of the anisotropic filler 3 in the first heat-conducting layer 1a on the line and the number of particles of the anisotropic filler 3 in the second heat-conducting layer 1b on the line, and taking the value when the summed number is smallest in the thickness direction.

Further, it is preferable that the anisotropic filler 3 included in the first heat-conducting layer 1a and the anisotropic filler 3 included in the second heat-conducting layer 1b do not substantially contact each other. It is noted that "not substantially contact" means that most of the anisotropic filler 3 included in the first heat-conducting layer 1a does not contact the anisotropic filler 3 included in the second heat-conducting layer 1b. Specifically, when the vicinity of the interface in cross-section is observed, the ratio of the number of particles of the anisotropic filler 3 in contact with each other is 3% or less, preferably 1% or less, and most preferably 0%. It is noted that the ratio of the number of particles in contact is, when 100 particles of the anisotropic filler 3 included in the first heat-conducting layer 1a and 100 particles of the anisotropic filler 3 included in the second heat-conducting layer 1b in the interface are observed, the ratio of the number of particles of the anisotropic filler 3 in contact with each other with respect to the total number of the observed particles (200).

As described above, since the anisotropic filler 3 in the first heat-conducting layer 1a and the anisotropic filler 3 in the second heat-conducting layer 1b are not in contact with each other in the interface 5, it is easy to secure electrical insulation properties in the thickness direction.

Further, in the interface 5, as described above, since the filling ratio of the anisotropic filler 3 becomes decreased, the filling ratio of the non-anisotropic filler 4 is increased by the decreased amount. As a result, as described above, the filling ratio of the non-anisotropic filler 4 in the interface 5 is higher than the filling ratio of the non-anisotropic filler 4 in the first and second heat-conducting layers 1a and 1b. That is, the ratio of the filling ratio of the non-anisotropic filler 4 in the interface 5 to the filling ratio of the non-anisotropic filler 4 in the first and second heat-conducting layers 1a and 1b is preferably greater than 100%.

The filling ratio of the non-anisotropic filler 4 in the interface 5 can be evaluated by the following method. That is, in the cross-section of the heat-conducting sheet 1, when a 400 μm line perpendicular to the thickness direction is drawn at the center position in the thickness direction of the first heat-conducting layer 1a, a ratio (B1) of the filling ratio of the non-anisotropic filler 4 on a line having the same length near the first heat-conducting layer 1a at the interface with respect to the filling ratio of the non-anisotropic filler 4 on the 400 μm line is estimated. Similarly, when a 400 μm line perpendicular to the thickness direction is drawn at the center position in the thickness direction of the first heat-conducting layer 1b, a ratio (B2) of the filling ratio of the non-anisotropic filler 4 on a line having the same length near the interface 5 at the second heat-conducting layer 2a with respect to the filling ratio of the non-anisotropic filler 4 on the 400 μm line is estimated. Then, an average value ((B1+B2)/2) is determined as the ratio of the filling ratio. It is preferable to have a region where the ratio of the filling ratio is 105% or more, and more preferably 110% or more. The upper limit of the filling ratio of the non-anisotropic filler 4 in the interface 5 is not particularly limited, but in practical terms it is 200%.

The interface 5 has a certain thickness. The thickness of the interface 5 is preferably 60 μm or less, more preferably 40 μm or less, and further preferably 30 μm or less. By setting the thickness of the interface 5 to be equal to or less than the above upper limit value, the lower end 3c of the anisotropic filler 3 in the first heat-conducting layer 1a and the upper end 3d of the anisotropic filler 3 in the second heat-conducting layer 1b come close to each other, and a decrease in thermal conduction properties due to the interface 5 can be prevented. It is noted that the thickness of the interface 5 can be calculated by measuring the distance between the above-described first and second boundary lines.

Further, it is acceptable that the thickness of the interface 5 is greater than 0 μm. The thickness is preferably 3 μm or more. By setting the thickness of the interface 5 to 3 μm or more, the electrical insulation properties of the first and second heat-conducting layers 1a and 1b are properly secured by the non-anisotropic filler 4 that is added in the interface 5 in a relatively large amount.

In addition, as described later, the heat-conducting sheet 1 is obtained by stacking and adhering a first sheet and a second sheet. However, at that time, bubbles may be formed in the interface 5. In the present embodiment, from the viewpoint of increasing the adhesion between the first and second heat-conducting layers 1a and 1b, bubbles content ratio in the interface 5 is preferably low. Specifically, when a 400 μm line perpendicular to the thickness direction is drawn in the interface 5 in cross-section, the ratio of the length overlapping bubbles on the line with respect to the total length of the line is preferably less than 20%, more preferably less than 10%, and most preferably 0%. The line perpendicular to the thickness direction may be drawn so that the bubbles content ratio becomes the highest. In order to reduce the bubbles content ratio in the interface, it is preferable to reduce the surface roughness Ra of the surfaces in contact with each other when the first and second sheets are adhered together, as described later in relation to the production method.

Further, in the present embodiment, the first and second heat-conducting layers 1a and 1b are adhered via the interface 5 that includes the polymer matrix 2, and are bonded without using a different material such as an adhesive layer. Therefore, there is no decrease in thermal conduction properties due to a different material being interposed between the layers.

<Additives>

In the heat-conducting sheet 1, various additives may be added in the polymer matrix 2 as long as the function of the heat-conducting sheet 1 is not impaired. Examples of these additives include at least one selected from a dispersant, a coupling agent, a pressure-sensitive adhesive, a fire retardant, an antioxidant, a colorant, an anti-settling agent, and the like. In the case of crosslinking or curing the curable polymer composition as described above, a crosslinking accelerator, a curing accelerator, or the like that accelerates crosslinking or curing may be added as an additive.

<Heat-Conducting Sheet>

The heat-conducting sheet 1 preferably has an E hardness of 5 to 80 as measured by a Japanese Industrial Standards JIS K6253 type E hardness meter. By setting the E hardness to 80 or less, conformability to the shape of the heat-generating element or heat-dissipating element is good, close-contact properties between the heat-generating element or heat-dissipating element and the heat-conducting sheet 1 is good, and thermal conduction properties are excellent. Further, by setting the E hardness to 5 or more, the shape can be easily maintained, and it is possible to prevent the orientation of the anisotropic filler 3 from being disturbed and the thermal conduction properties decreasing due to compression.

The hardness of the heat-conducting sheet 1 may be obtained by, when the hardness of the first heat-conducting layer 1a and the second heat-conducting layer 1b constituting the heat-conducting sheet 1 are different, measuring the hardness of both surfaces using a hardness meter, and taking the average value thereof. Further, when the thickness of the heat-conducting sheet 1 is less than 10 mm, the hardness may be obtained by stacking a plurality of the heat-conducting sheets 1 so that the total thickness is 10 mm or more, and measuring the resultant stack. It is noted that in JIS K6253, when a plurality of sheets are stacked, the upper limit is set to three, but in the present invention, the measurement may be carried out by stacking more than three sheets as necessary.

By the way, since the heat-conducting sheet 1 becomes harder by increasing the content of the anisotropic filler 3 or the non-anisotropic filler 4, in order for the hardness of the heat-conducting sheet 1 to be within the preferable range, a polymer matrix that is softer than the desired hardness is selected.

The thermal conductivity in the thickness direction of the heat-conducting sheet 1, that is, in the orientation direction of the anisotropic filler 3, is preferably 6 W/m·K or more. Although there is no particular upper limit, the upper limit may be, for example, 50 W/m·K. The thermal conductivity is measured by the method according to ASTM D5470-06.

Further, the thermal resistance value in the thickness direction of the heat-conducting sheet 1 is preferably 0.7° C./W or less when the thickness is 0.5 mm. Although there is no particular lower limit, the lower limit may be, for example, 0.03° C./W.

Further, when the heat-conducting sheet 1 contains an anisotropic filler 3 having electrical conductivity, as the index of the electrical conductivity, the volume resistivity is preferably $1.0 \times 10^9$ Ω·cm or more. When the volume resistance value is equal to or higher than this lower limit value, the heat-conducting sheet 1 can secure sufficient electrical insulation properties in the thickness direction. In addition, the upper limit of the volume resistivity is not particularly limited, but in practical terms it is $1.0 \times 10^{14}$ Ω·cm.

The volume resistivity is determined from a resistance value measured with a tester when the heat-conducting sheet 1 is sandwiched between gold-plated metal plates and is compressed to 80% (20% compression) relative to the initial thickness, and the thickness and cross-sectional area of the heat-conducting sheet 1.

In the heat-conducting sheet 1, a surface 1c on the first heat-conducting layer 1a side preferably has a lower friction coefficient than a surface 1d on the second heat-conducting layer 1b side. That is, it is preferable that the surface 1c on the first heat-conducting layer 1a side has a low friction coefficient and the surface 1d on the second heat-conducting layer 1b side has a high friction coefficient.

Further, the surface 1c on the first heat-conducting layer 1a side may be a non-pressure-sensitive adhesive surface, and the surface 1d on the second heat-conducting layer 1b side may be a pressure-sensitive adhesive surface. When the heat-conducting sheet 1 has one surface 1c as a non-pressure-sensitive adhesive surface and the other surface 1d as a pressure-sensitive adhesive surface, the heat-conducting sheet 1 can be slid or the like when attaching it to an electronic device or the like, and the heat-conducting sheet 1 can be fixed to the adherend surface via the surface 1d.

Here, the surface 1c on the first heat-conducting layer 1a side preferably has a friction coefficient of less than 0.3, and more preferably less than 0.25. Further, the friction coefficient of the surface 1c on the first heat-conducting layer 1a side is usually 0.05 or more, although the lower limit thereof is not particularly limited. When the friction coefficient is less than 0.3, the surface 1c on the first heat-conducting layer 1a side can be made to be a non-pressure-sensitive adhesive surface.

Further, the friction coefficient of the surface 1d on the second heat-conducting layer 1b side is preferably 0.3 or more, and more preferably 0.5 or more. When the friction coefficient of the surface 1d on the second heat-conducting layer 1b side is 0.3 or more, the surface 1d on the second heat-conducting layer 1b side can be made to be a pressure-sensitive adhesive surface.

It is noted that the friction coefficient is a friction coefficient with respect to aluminum measured according to the method described in the Examples described later.

Here, in order to make the surface 1c on the first heat-conducting layer 1a side have a low friction coefficient or to make it a non-pressure-sensitive adhesive surface, as illustrated in FIG. 1, on the surface 1c on the first heat-conducting layer 1a side, the anisotropic filler 3 may protrude from the polymer matrix 2. At this time, the protrusion height of the anisotropic filler 3 is preferably 1 to 50 μm.

Further, when the anisotropic filler 3 protrudes from the surface 1c, the tip of the protruded anisotropic filler 3 may be ground. Such an anisotropic filler 3 may include a protrusion having a shape in which the tip of the anisotropic filler 3 extends along the surface 1c. In such an anisotropic filler 3, the cross-sectional area orthogonal to the long-axis direction of the tip is larger than the cross-sectional area orthogonal to the long-axis direction of the shaft portion (for example, the base of the protruding filler). The anisotropic filler 3 having such a shape preferably has a protrusion height of 1 to 20 μm.

In this way, the surface where the anisotropic filler 3 protrudes on the surface 1c of the first heat-conducting layer 1a becomes a flat surface having a low friction coefficient by contacting the anisotropic filler 3 that is harder than the polymer matrix 2 with the surrounding members.

Further, in order to have a high friction coefficient, the surface 1d on the second heat-conducting layer 1b side may be a flat surface on which the anisotropic filler 3 is embedded inside the polymer matrix 2. On such a surface 1d, the anisotropic filler 3 does not protrude from the polymer matrix 2, and the anisotropic filler 3 is exposed to the surface 1d as little as possible. Therefore, the surface 1d on the second heat-conducting layer 1b side has a friction coefficient that depends on the properties of the polymer matrix 2, and hence can be a flat surface having a high friction coefficient by using the above-mentioned rubber or the like, or may also be a pressure-sensitive adhesive surface.

However, in the present embodiment, like the surface 1d on the second heat-conducting layer 1b side, the surface 1c on the first heat-conducting layer 1a side may also have a high friction coefficient. That is, both surfaces 1c and 1d of the heat-conducting sheet 1 may be pressure-sensitive adhesive surfaces having a high friction coefficient.

In this case, the surface 1c on the first heat-conducting layer 1a side may have the same structure as the surface 1d on the second heat-conducting layer 1b side, the specific details thereof may be as described above, and the anisotropic filler 3 does not protrude from the surface 1c.

In the heat-conducting sheet 1, the anisotropic filler 3 contained in the first heat-conducting layer 1a and the anisotropic filler 3 contained in the second heat-conducting layer 1b may be the same material or different materials.

Further, the filling ratios of the anisotropic filler 3 in the first and second heat-conducting layers 1a and 1b may be the same or different. When the filling ratios are different, for example, it is preferable that the filling ratio of the first heat-conducting layer 1a configured so that the surface 1c has a low friction coefficient be higher than the filling ratio of the second heat-conducting layer 1b configured so that the surface 1d has a high friction coefficient. With such a configuration, the pressure-sensitive adhesive force of the surface 1d on the second heat-conducting layer 1 side can be increased while further reducing the friction coefficient of the surface 1c on the first heat-conducting layer 1a side. Therefore, the difference in friction coefficients can be made more prominent, which is suitable for applications utilizing the slidability of a surface having low friction coefficient, for example.

The thickness of each of the first and second heat-conducting layers 1a and 1b is, for example, 0.1 to 5 mm, and preferably 0.15 to 3 mm.

The thicknesses of the first and second heat-conducting layers 1a and 1b may be the same or different from each other. In this case, by making the hardness and other functionalities of the first heat-conducting layer 1a and the second heat-conducting layer 1b different from each other, those functions can be effectively expressed.

For example, the thickness of the second heat-conducting layer 1b may be set larger than that of the first heat-conducting layer 1a while setting the filling ratio of the anisotropic filler 3 in the first heat-conducting layer 1a configured so that the surface 1c has a low friction coefficient to be higher than that in the second heat-conducting layer 1b configured so that the surface 1d has a high friction coefficient. According to such a configuration, while the heat-conducting sheet 1 has high flexibility as a whole, because the surface 1c of the first heat-conducting layer 1a has a low friction coefficient, the heat-conducting sheet 1 is suitable for applications utilizing the slidability of the surface 1c.

The heat-conducting sheet 1 is used in electronic devices, for example. Specifically, the heat-conducting sheet 1 is interposed between a heat-generating element and a heat-dissipating element to allow heat generated by the heat-generating element to move to the heat-dissipating element and be dissipated therefrom. Here, examples of the heat-generating element include various electronic components such as a CPU, a power amplifier, and a power source, which are used in an electronic device. Examples of the heat-dissipating element include a heat sink, a heat pump, a metal housing of an electronic device, and the like. The heat-conducting sheet 1 is used in such a manner that both surfaces 1c, 1d are in close contact with and compressed against the heat-generating element and the heat-dissipating element.

<Method for Producing Heat-Conducting Sheet>

An example of a method for producing the above-described heat-conducting sheet includes a method in which a first sheet and a second sheet are produced separately and then stacked and adhered. Here, the first sheet and the second sheet serve as the first and second heat-conducting layers 1a and 1b in the heat-conducting sheet 1, respectively. Therefore, the first and second sheets each include a polymer matrix and an anisotropic filler, and the anisotropic filler is oriented in the thickness direction. In addition, the first and second sheets each further contain a non-anisotropic filler. Here, the content of the anisotropic filler and the non-anisotropic filler in each of the first and second sheets is preferably within the ranges described above. The thickness of the first and second sheets is the same as that of the above-described first and second heat-conducting layers, and is, for example, 0.1 to 5 mm, and preferably 0.15 to 3 mm.

In the present production method, the method of stacking and adhering the first and second sheets is not particularly limited, and examples thereof include a method of pressing at normal temperature and a hot-pressing method. As described later, the first and second sheets can be adhered to each other by simply pressing at normal temperature by making, for example, the stacking surface of the first sheet a pressure-sensitive adhesive surface.

An example of the method for producing each of the first and second sheets includes a magnetic field orientation production method in which a mixed composition including a liquid polymer composition that becomes a polymer matrix after curing, the anisotropic filler, and the non-anisotropic filler is placed in a magnetic field to orient the anisotropic filler along the magnetic field, and then an orientated formed body is obtained by curing the polymer composition.

In order to perform the magnetic field orientation, it is preferable that the viscosity of the mixed composition is 10 to 300 Pa·s. By setting to 10 Pa·s or more, the anisotropic filler and the non-anisotropic filler are less likely to settle. Further, by setting to 300 Pa·s or less, fluidity is good, the anisotropic filler is properly oriented in the magnetic field, and there are no problems like the orientation taking too long. It is noted that the viscosity is a viscosity measured at a rotation speed of 10 rpm at 25° C. using a rotational viscometer (Brookfield viscometer DV-E, spindle SC4-14).

However, when using an anisotropic filler or non-anisotropic filler that does not easily settle or when combining an additive such as an anti-settling agent, the viscosity of the mixed composition may be less than 10 Pa·s.

In the magnetic field orientation production method, examples of the magnetic field line source for applying the magnetic field lines include a superconducting magnet, a permanent magnet, an electromagnet, and the like, but a superconducting magnet is preferable because it can generate a magnetic field having a high magnetic flux density. The magnetic flux density of the magnetic field generated from the magnetic force line generation source is preferably 1 to 30 tesla. By setting the magnetic flux density to 1 tesla or more, it is possible to easily orient the above-described anisotropic filler composed of a carbon material or the like. Further, by setting to 30 Tesla or less, it is possible to practically produce the sheets.

In the magnetic field orientation production method, the orientation of the anisotropic filler by the magnetic field and the curing may be performed in a mold in which a hollow portion corresponding to the sheet shape is partitioned inside. When orientation and the curing are performed using such a mold, both surfaces of the obtained oriented formed body are made to be a skin layer having a lower filling ratio of the anisotropic filler than that of the other portions, and this magnetic field formed body is used as the second sheet. A release film may be arranged in the mold at a position in contact with each surface of the orientated formed body, and the magnetic field formed body may be molded between the release films. As the release film, for example, a resin film having good releasability or a resin film having one surface that has been release-treated with a release agent or the like is used. Using the release film facilitates the release of the oriented formed body t from the mold.

The skin layer of this orientated formed body (second sheet) contains the polymer matrix, and has the filling ratio of the anisotropic filler therein that is lower than that in the other portions (portions other than the skin layer). Further, the skin layer usually does not contain the anisotropic filler. Moreover, both surfaces of the second sheet are surfaces on which the anisotropic filler does not protrude. The skin layer of the second sheet has the filling ratio of the anisotropic filler therein that is similarly lower than that in the portions other than the skin layer of the first sheet described later.

Further, in the skin layer of this orientated formed body (second sheet), the filling ratio of the non-anisotropic filler is higher than that in the other portions (portions other than the skin layer). In addition, the skin layer of the second sheet has the filling ratio of the non-anisotropic filler therein that is similarly higher than that in the portions other than the skin layer of the first sheet described later.

On the other hand, for the first sheet, it is preferable to firstly produce an orientated formed body that is thicker than the first sheet to be obtained, and then slice or cut the orientated formed body along the plane direction to obtain the first sheet. As a result, at least one surface of the first sheet is a surface on which the tip of the anisotropic filler protrudes from the polymer matrix due to the slicing or cutting. Moreover, it is more preferable that both surfaces of the first sheet are surfaces on which the tip of the anisotropic filler protrudes. In addition, the surface on which the tip of the anisotropic filler protrudes due to the slicing or cutting may be appropriately ground using grinding paper or the like.

Further, the first sheet may be produced by the same method as the second sheet. That is, similar to second sheet, both surfaces of the first sheet may be a skin layer.

For the first and second sheets, either one of the surfaces may be a skin layer, while the other surface is not a skin layer and may be a surface on which the tip of the anisotropic filler protrudes. However, from the viewpoint of facilitating the production of the first and second sheets, it is preferable that both surfaces are surfaces on which a skin layer is provided, or that both surfaces are surfaces on which the anisotropic filler protrudes.

Next, in the present production method, the first sheet and the second sheet are stacked so that one surface of the second sheet on which the skin layer is formed is in contact with one surface of the first sheet, and the sheets are adhered to obtain a heat-conducting sheet. As a result, in the heat-conducting sheet 1, the interface 5 is formed by the skin layer, and the first and second heat-conducting layers 1a and 1b formed by the first and second sheets, respectively, are adhered by the interface 5.

Here, as described above, the skin layer has the lower filling ratio of the anisotropic filler than that in the portions other than the skin layer. Therefore, in the heat-conducting sheet 1, as described above, the filling ratio of the anisotropic filler 3 in the interface 5 is lower than the filling ratio of the anisotropic filler 3 in the first and second heat-conducting layers 1a and 1b. On the other hand, in the skin layer, as described above, the filling ratio of the non-anisotropic filler is higher than that in the portions other than the skin layer. Therefore, in the heat-conducting sheet 1, as described above, the filling ratio of the non-anisotropic filler 4 in the interface 5 is higher than the filling ratio of the non-anisotropic filler 4 in the first and second heat-conducting layers 1a and 1b.

Further, since the skin layer has pressure-sensitive adhesive properties by using rubber or the like for the polymer matrix, by stacking one surface of the second sheet provided with the skin layer on one surface of the first sheet, the first and second sheets are adhered via a surface having pressure-sensitive adhesive properties. Therefore, in the heat-conducting sheet 1, the adhesion between the first heat-conducting layer 1a and the second heat-conducting layer 1b is good.

As described above, since the second sheet has a skin layer provided on both surfaces, the surface 1d on the second heat-conducting layer 1b side in the heat-conducting sheet 1 is formed from the skin layer, and thus has a high friction coefficient as described above. However, as described above, the second sheet may be provided with a skin layer on one surface, and the other surface may be a surface on which the anisotropic filler 3 protrudes, in such a case the surface 1d has a low friction coefficient.

In the above-described production method, one surface of the first sheet (that is, the stacking surface in contact with the second sheet) may be a surface provided with a skin layer as described above, but it is preferably a surface on which a skin layer is not provided, on which the anisotropic filler protrudes from the polymer matrix. If this surface is a surface provided with a skin layer, the pressure-sensitive adhesive surfaces of the first and second sheets adhere to each other, for example, and the adhesion between those surfaces will be even better.

On the other hand, even if the one surface (stacking surface) is a surface on which the anisotropic filler protrudes, the adhesion of this surface to the second sheet can be improved by reducing the surface roughness Ra thereof as described later.

Further, similar to the above-described one surface (stacking surface), the other surface of the first sheet (that is, the surface opposite to the surface to be stacked on the second sheet) is preferably a surface on which the anisotropic filler protrudes from the polymer matrix. By making the other surface of the first sheet a surface on which the anisotropic filler protrudes, in the heat-conducting sheet 1, the surface 1c on the first heat-conducting layer 1a side has a low friction coefficient, and can be made to be a non-pressure-sensitive adhesive surface.

However, the other surface of the first sheet may be the surface provided with a skin layer. When the other surface is a surface provided with a skin layer, in the heat-conducting sheet 1, the surface 1c on the first heat-conducting layer 1a side has a high friction coefficient, and can be made to be a pressure-sensitive adhesive surface. That is, in the heat-conducting sheet 1, both the surfaces 1c and 1d may be pressure-sensitive adhesive surfaces.

In the production method described above, the first and second sheets have a surface roughness Ra of the surfaces (stacking surfaces) contacting each other of, for example, 10 μm or less. However, preferably, at least one of these surfaces has a surface roughness Ra of 4 µm or less, and more preferably, at least one of these surfaces has a surface roughness Ra of 1 µm or less or both have a surface roughness Ra of 4 µm or less. When the surface roughness Ra of the one of the surfaces that are in contact with each other is 4 µm or less, the adhesion of the first and second sheets is good, and as described above, bubbles are less likely to occur in the interface. Further, when at least one of these surfaces has a surface roughness Ra of 1 µm or less, or both surfaces have a surface roughness Ra of 4 µm or less, adhesion is further improved and bubbles are even less likely to occur. It is noted that a lower surface roughness Ra is better, but in practical terms the surface roughness Ra can be 0.1 µm or more. It is also noted that when simply the term "surface roughness Ra" is used in the present invention, it means the arithmetic mean height Ra defined in JIS B0601.

As described above, the surface of the second sheet is provided with a skin layer, and the surface roughness Ra thereof is usually 4 µm or less. The same applies when a skin layer is provided on the surface of the first sheet.

On the other hand, when the surface of the first sheet is a surface which on which the anisotropic filler protrudes, since the surface roughness Ra of that surface is usually large, it is necessary to perform a treatment for reducing the surface roughness Ra. Specifically, the surface formed by slicing or cutting may be further ground with a precision grinding sheet to increase smoothness. Examples of the precision grinding sheet may include a grinding film composed of a resin film mixed with a powder having a controlled particle size distribution and particle size. The surface formed by slicing or cutting may also be ground with ordinary grinding paper before grinding with the precision grinding sheet.

Thus, even when the surface (stacking surface) of the first sheet is a surface on which the anisotropic filler protrudes, by reducing its surface roughness Ra and providing a skin layer on the surface (stacking surface) of the second sheet to have, for example, a pressure-sensitive adhesive surface as described above, it is possible to adhere the first sheet and the second sheet.

The first and second sheets are adhered utilizing the properties of the polymer matrix, and as described above, it is preferable that the sheets are adhered utilizing the pressure-sensitive adhesive properties of the polymer matrix.

Further, in at least one of the first and second sheets, the polymer composition may be semi-cured rather than completely cured, the first and second sheets may be stacked while at least one of them is in a semi-cured state, and then cured and adhered to each other. Here, "semi-cured state" refers to a state in which the curing reaction progresses to such an extent that a solid is formed but unreacted functional groups remain.

The curing reaction may be a single reaction or a combination of a plurality of reactions. For example, semi-curing may be carried out by performing a curing reaction that proceeds at 80° C. as a first stage reaction, and then the first and second sheets are adhered by performing a curing reaction that proceeds at 150° C. as a second stage reaction.

In addition, in the above-described production method, the anisotropic filler is oriented by utilizing a magnetic field, but the anisotropic filler may be oriented by another method. For example, flow orientation may be utilized. More specifically, there can be used a laminated slice production method in which preliminary sheets having a thin sheet shape are produced by applying a shearing force to a mixed composition, a laminated block is produced by laminating a plurality of those sheets, and the laminated block is sliced.

In the laminated slice production method, firstly, an anisotropic filler, a non-anisotropic filler, and optionally various additives are added to a polymer composition, and the mixture is stirred to prepare a mixed composition in which the added solids are uniformly dispersed. Here, the polymer compound used in the polymer composition may be a polymer compound that is a liquid at normal temperature (23° C.) or a polymer compound that is a solid at normal temperature. Further, the polymer composition may contain a plasticizer.

The mixed composition has a relatively high viscosity so that a shearing force is applied when it is stretched into a sheet shape. Specifically, the mixed composition has a viscosity of preferably 3 to 50 Pa·s. The mixed composition preferably contains a solvent in order to obtain the above viscosity.

Next, the mixed composition is stretched flat while applying shearing force to form a sheet (preliminary sheet). By applying a shearing force, the anisotropic filler can be oriented in the shearing direction. Examples of the sheet forming means include methods in which the mixed composition is applied onto a base film by a coating applicator such as a bar coater or a doctor blade, or by extrusion molding or discharging from a nozzle or the like, and optionally drying the mixed composition. At this time, the mixed composition may optionally be semi-cured. The preliminary sheet thickness is preferably about 50 to 250 µm. In the preliminary sheet, the anisotropic filler is oriented in one direction along the plane direction of the sheet.

Next, a plurality of preliminary sheets are laminated so that the orientation directions are the same, then the mixed composition is cured as necessary by heating, UV irradiation or the like, and the preliminary sheets are made to adhere to each other by heat-pressing or the like to form a laminated block. Then, the laminated block can be cut in the direction orthogonal to the orientation direction of the anisotropic filler to obtain a sheet having a surface from which the anisotropic filler protrudes.

Second Embodiment

Figure 2:
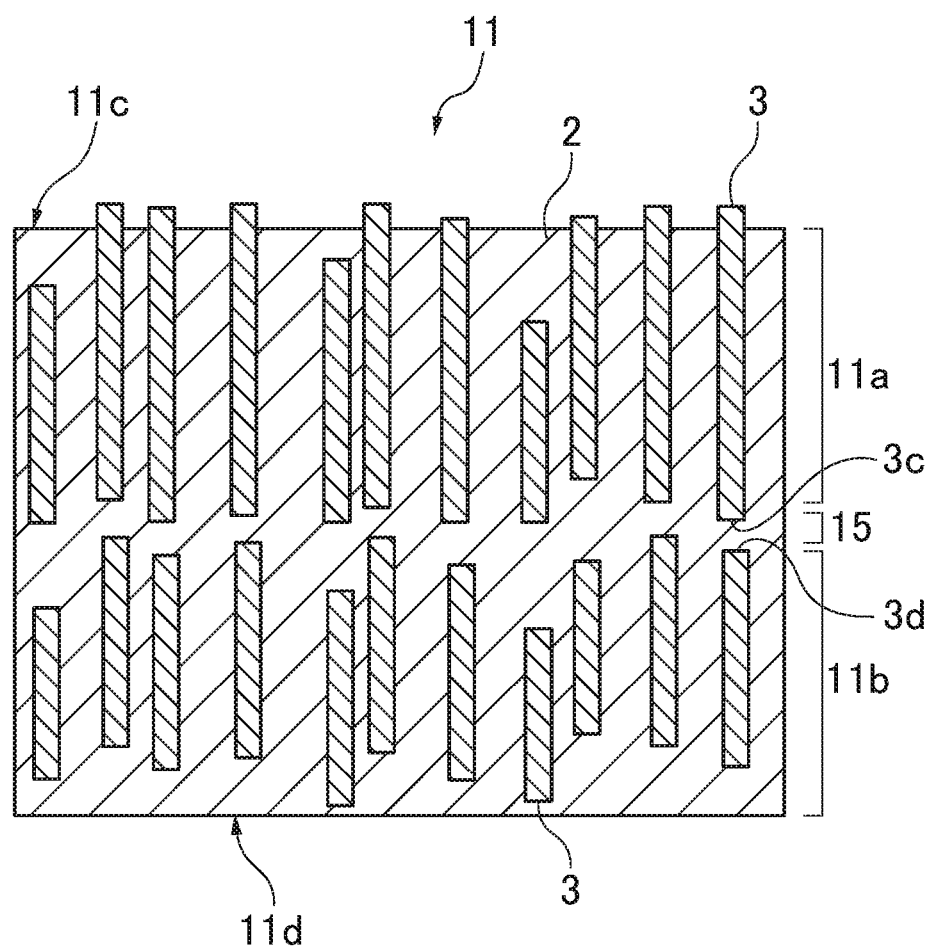
FIG. 2 is a schematic cross-sectional view illustrating a heat-conducting sheet according to a second embodiment.

Next, a heat-conducting sheet according to the second embodiment of the present invention will be described with reference to FIG. 2.

In the first embodiment, in addition to the anisotropic filler 3, the heat-conducting sheet 1 contains the non-anisotropic filler 4 as a filler. However, in the present embodiment, as illustrated in FIG. 2, the non-anisotropic filler is not contained.

The heat-conducting sheet 11 of the second embodiment is the same as the heat-conducting sheet of the first embodiment described above, except that it does not contain the non-anisotropic filler. Therefore, a description of the same parts is omitted.

In the present embodiment as well, by laminating first and second heat-conducting layers 11a and 11b via an interface 15 having the low filling ratio of the anisotropic filler 3 as in the first embodiment, good adhesion between layers can be achieved while securing thermal conduction properties in the thickness direction in the heat-conducting sheet 11.

Further, as described above, by making the surface 11c on the first heat-conducting layer 11a side have a low friction coefficient and the surface 11d on the second heat-conducting layer 11b side have a high friction coefficient, the heat-conducting sheet 11 can be slid or the like when attaching it to an electronic device or the like, and can be fixed to the adherend surface via the surface 11d. Of course, both surfaces 11c and 11d of the heat-conducting sheet 11 may be pressure-sensitive adhesive surfaces.

In addition, as described above, by appropriately adjusting the filling ratio of the anisotropic filler 3 in the first heat-conducting layer 11a and the second heat-conducting layer 11b, and appropriately adjusting the thickness of these heat-conducting layers 11a and 11b, various properties can be imparted to the heat-conducting sheet 11.

Further, in the first and second embodiments described above, there is only described structures having two heat-conducting layers, but the structure may have three or more heat-conducting layers. In this case, the above-described interface may be arranged between the heat-conducting layers to adhere the heat-conducting layers to each other. In the case of having three or more heat-conducting layers, the structure of each heat-conducting layer and the interface is the same as above, and thus a description thereof is omitted here. However, from the viewpoint of production cost and the like, in the present invention, the number of heat-conducting layers is preferably two.

EXAMPLES

The present invention will now be described in more detail with reference to Examples, but the present invention is not limited to these Examples.

In the Examples, the physical properties of the heat-conducting sheet were evaluated by the following methods.

[Hardness]

The hardness of the heat-conducting sheet of each sample is the E hardness as measured using a type E durometer according to the JIS K6253 standard.

[Thermal Resistance Value]

Figure 3:
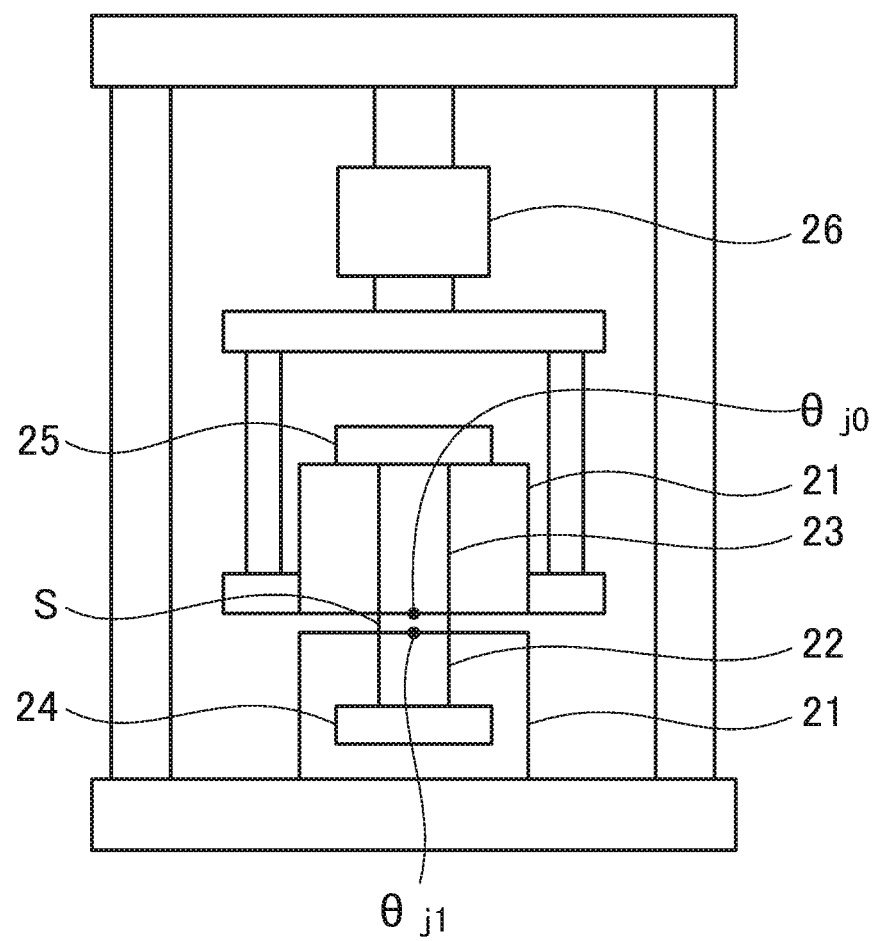
FIG. 3 is a schematic view of a thermal resistance measuring machine.

The thermal resistance value was measured by the following method using a thermal resistance measuring machine as shown in FIG. 3. Specifically, for each sample, a test piece S having a size of 10 mm×10 mm was prepared for measuring the thermal resistance value. Then, each test piece S was adhered onto a copper block 22 having a measurement surface of 10 mm×10 mm and a side surface covered with a heat insulating material 21, and was sandwiched by an upper copper block 23. A load was applied by a load cell 26 to set a thickness of 87.5% of the original thickness. Here, the lower copper block 22 is in contact with a heater 24. The upper copper block 23 was connected to a heat sink 25 equipped a fan. Next, the heater 24 was caused to generate 25 W of heat, and after 10 minutes when the temperature became a substantially steady state, the temperature of the upper copper block 23 ($\theta_{j0}$), the temperature of the lower copper block 22 ($\theta_{j1}$), and the amount of heat generated by the heater (Q) were measured. The thermal resistance value of each sample was calculated from the following expression (1).

$$\text{Thermal resistance} = (\theta_{j1} - \theta_{j0})/Q \quad (1)$$

In expression (1), $\theta_{j1}$ is the temperature of the lower copper block 22, $\theta_{j0}$ is the temperature of the upper copper block 23, and Q is the amount of generated heat.

[Surface Roughness Ra]

The surface roughness Ra of each sample was measured using a shape analysis laser microscope VK-X150 (manufactured by KEYENCE Corporation) before stacking on another sample. The measurement was carried out on an arbitrary linear area of 0.6 mm on the sample surface.

[Friction Coefficient]

The friction coefficient is a static friction coefficient obtained by the following method. Specifically, each test piece was placed on a horizontal table, and then a sliding piece and a 120 g weight (a cylindrical shape having a diameter of 28 mm and a height of 25 mm) were placed on the test piece in that order. Next, one end of a tape for pulling was attached to the weight, and the other end of the tape was fixed to a push-pull gauge (CPU gauge M-9500, manufactured by Aikoh Engineering Co., Ltd.). Then, the push-pull gauge was pulled in a direction parallel to the outer surface of the test piece at a rate of 100 mm/min.

At this time, a static friction force Fs (N) between the test piece and the sliding piece when the push-pull gauge was pulled was measured, and the static friction coefficient was calculated by the following expression (2). Here, for each test piece, measurement of the static friction force Fs and calculation of the static friction coefficient were carried out five times, and the average value of those static friction coefficient values was taken as the static friction coefficient of the test piece surface. Here, an aluminum foil tape (Scotch Brand Tape 433HD, manufactured by 3M) was used as the sliding piece. The aluminum foil tape was placed so that the aluminum foil surface of the tape faced each test piece.

$$\text{Static friction coefficient} = Fs(N)/Fp(N) \quad (2)$$

In the above expression (2), Fp represents the vertical drag force generated by the mass (weight) of the sliding piece, and the value of Fp represented as 0.12 kg (weight of the weight)×9.8 m/s² (gravitational acceleration)=0.1176 N.

[Volume Resistivity]

The volume resistivity was measured under the following conditions. First, a sheet sample was sandwiched between gold-plated copper electrodes having a diameter of 20 mm. Then, the sheet was compressed by 20% so that the sheet was made to have the thickness of 80% relative to the original thickness by a spacer, and after leaving to stand for 1 minute the resistance value was measured. Then, the volume resistivity was calculated from each measured resistance value, the test piece thickness, and the cross-sectional area of the electrodes and the test piece.

$$\text{Volume resistivity } (\Omega \cdot \text{cm}) = \text{Resistance value } (\Omega) \times \text{Cross-sectional area } (\text{cm}^2)/\text{Thickness (cm)} \quad (3)$$

[Interface Thickness, Ratio of Intersecting Anisotropic Filler, Bubbles Content Ratio]

A cross-section of each sample was observed at a magnification of 200 using a scanning electron microscope. Then, for each cross-section, the boundary lines demarcating region having the ratio of anisotropic filler of 20% or less were obtained by the method described in the specification, and the distance between the boundary line of the first heat-conducting layer and the boundary line of the second heat-conducting layer near the adhesion surface was taken as the thickness of the interface. In addition, the ratio of intersecting anisotropic filler and the bubbles content ratio for each cross-section were measured by the methods described in the specification.

[Filling Ratio of Non-Anisotropic Filler]

Using a scanning electron microscope, a cross-section of each sample was observed at a magnification of 200. Then, according to the method described in the specification, for each cross-section, the ratio of the length occupied by the polymer matrix and the non-anisotropic filler on the 400 μm line segment at the vicinity of the interface (for convenience, referred to as "$b_a$") (in other words, the length obtained by subtracting the length the occupied by the anisotropic filler from the total length) was compared with a ratio ($b_1$) of the central portion of the first heat-conducting layer and a ratio ($b_2$) of the central portion of the second heat-conducting layer obtained in the same manner to estimate the filling ratio of non-anisotropic filler. Specifically, the filling ratio of the non-anisotropic filler at the interface with the first heat-conducting layer was calculated as $B1=b_a/b_1$, and the filling ratio of the non-anisotropic filler at the interface with the second heat-conducting layer was calculated as $B2=b_a/b_2$, and then the average value $((B1+B2)/2)$ thereof was calculated as the ratio of the filling ratio expressed as a percentage (%).

[Preparation of First and Second Sheets]

(Sample 1)

A mixed composition was obtained by mixing an alkenyl group-containing organopolysiloxane and organohydrogenpolysiloxane (100 parts by mass in total) as the polymer matrix, and 120 parts by mass of graphitized carbon fiber (average fiber length 100 μm, aspect ratio 10, thermal conductivity 500 W/m·K, having electrical conductivity) as the anisotropic filler and 500 parts by mass of aluminum oxide powder (spherical, average particle size 5 μm, aspect ratio 1.0, having electrical insulation properties). The viscosity of the mixed composition was 100 Pa·s.

Next, a release film was arranged on the upper and lower surfaces of an inside of a mold set to a predetermined thickness, and the mixed composition was injected therein. A magnetic field of 8 T was applied in the thickness direction to orient the graphitized carbon fiber in the thickness direction, and then the polymer matrix was cured by heating at 80° C. for 60 minutes to obtain a sheet-shaped sample 1 having a thickness of 0.2 mm. Both surfaces of the sheet-shaped sample 1 were formed of a skin layer not containing an anisotropic filler. Both surfaces had a friction coefficient of 0.5 or more, and had pressure-sensitive adhesive properties. Further, both surfaces of the sheet-shaped sample 1 had a surface roughness Ra of 0.37 μm.

(Sample 2)

Firstly, the same mixed composition as sample 1 was prepared. Next, the mixed composition was injected into a mold set to have a thickness sufficiently larger than each sample, and a magnetic field of 8 T was applied in the thickness direction to orient the graphitized carbon fiber in the thickness direction. The matrix was then cured by heating at 80° C. for 60 minutes to obtain a block-shaped molded body.

Next, the block-shaped molded body was cut into a sheet having a thickness of 0.2 mm using a shearing blade to obtain a sheet in which carbon fibers were exposed.

Then, a sheet-shaped sample 2 having a thickness of 0.2 mm was obtained by grinding the surface of the sheet with grinding paper having grinding particles of 10 μm in size to process the ends of the carbon fibers exposed from the surface to form protrusions extending parallel to the surface.

Both surfaces of the sheet-shaped sample 2 had a friction coefficient of less than 0.25, and were non-pressure-sensitive adhesive surfaces. Further, both surfaces of the sheet-shaped sample 2 had a surface roughness Ra of 8.1 μm.

(Sample 3)

The surface of a sheet produced same as sample 2 was grinded by using a precision grinding film having grinding particles formed of aluminum oxide having a particle size of 60 μm to increase smoothness, thereby obtaining a sheet-shaped sample 3 having a thickness of 0.2 mm.

Both surfaces of the sheet-shaped sample 3 had a friction coefficient of less than 0.25, and were non-pressure-sensitive adhesive surfaces. The surface roughness Ra of both surfaces of the sheet-shaped sample 3 was 3.8 μm.

(Sample 4)

A liquid mixed composition was obtained by mixing a mixture of 50 parts by mass of nitrile rubber and 50 parts by mass of bis [2-(2-butoxyethoxy)ethyl] adipate (100 parts by mass in total) as the polymer matrix, 120 parts by mass of graphitized carbon fiber (average fiber length 100 μm, aspect ratio 10, thermal conductivity 500 W/m·K, having electrical conductivity) as the anisotropic filler and 500 parts by mass of aluminum oxide powder (spherical, average particle size 5 μm, aspect ratio 1.0, having electrical insulation properties), and 300 parts by mass of cyclohexane as a solvent. The viscosity of the mixed composition was 10 Pa·s.

Next, the mixed composition was applied onto a release film with a bar coater, and the solvent was dried to obtain a 100 μm-thick pre-oriented sheet in which anisotropic filler was oriented in the coating direction.

Then, 125 pre-oriented sheets were stacked and compressed while heating to obtain a laminated sheet having a thickness of 10 mm. It is noted that when obtaining the laminated sheet, the thickness was compressed by 20%.

Then, using a shear blade, the block-shaped laminated sheet was cut to a thickness of 0.4 mm to obtain a sheet. In the obtained sheet, graphitized carbon fiber protruded on both surfaces of the sheet. It is noted that the cutting direction was perpendicular to the lamination direction of the pre-orientated sheets.

Then, both surfaces of the obtained sheet were ground using grinding paper having grinding particles 10 μm in size to process the ends of the carbon fibers exposed from the surface, and then the further ground using a precision grinding film having grinding particles formed of aluminum oxide having a particle size of 60 μm to increase smoothness, thereby obtaining a sheet-shaped sample 4 having a thickness of 0.2 mm. Both surfaces of the sheet-shaped sample 4 had a friction coefficient of less than 0.25, and were non-pressure-sensitive adhesive surfaces. The surface roughness Ra of both surfaces of the sheet-shaped sample 4 was 4.0 μm.

Example 1

Two sheets of the sheet-shaped samples 1 were provided, stacked, and then adhered together by pressing with a roll press at room temperature (25° C.) under a pressure of 1 MPa to obtain a heat-conducting sheet.

The heat-conducting sheet of Example 1 had first and second heat-conducting layers each formed from sample 1 and each having a thickness of 0.2 mm, and the first and second heat-conducting layers were adhered together via an interface having a thickness of 18 μm. When a cross-section of the heat-conducting sheet of Example 1 was observed, almost no graphitized carbon fibers were present in the interface and no bubbles were present. Further, the filling ratio of the aluminum oxide powder in the interface was 119% with respect to the filling ratio of the aluminum oxide powder in the first and second heat-conducting layers. In addition, both surfaces of the heat-conducting sheet had a friction coefficient of 0.5 or more, and had pressure-sensitive adhesive properties. Table 1 shows the other evaluation results of the heat-conducting sheet.

Example 2

The sheet-shaped sample 1 and sample 2 were provided, stacked, and then adhered together by pressing in the same manner as Example 1 to obtain a heat-conducting sheet. The heat-conducting sheet of Example 2 had a first and second heat-conducting layers formed from samples 2 and 1 respectively, and each having thickness of 0.2 mm, and the first and second heat-conducting layers were adhered together via an interface having a thickness of 10 μm. When a cross-section of the heat-conducting sheet of Example 2 was observed, although not many graphitized carbon fibers were present in the interface, tiny bubbles were present, and the bubbles content ratio in the interface was 2.1%. Further, the filling ratio of the aluminum oxide powder in the interface was 110% with respect to the filling ratio of the aluminum oxide powder in the first and second heat-conducting layers. In addition, the surface on the first heat-conducting layer side of the heat-conducting sheet had a friction coefficient of less than 0.25, and was a non-pressure-sensitive adhesive surface, and the surface on the second heat-conducting layer side of the heat-conducting sheet had a friction coefficient of 0.5 or more, and was a pressure-sensitive adhesive surface. Table 1 shows the other evaluation results of the heat-conducting sheet.

Example 3

The sheet-shaped sample 1 and sample 3 were provided, stacked, and then adhered together by pressing in the same manner as Example 1 to obtain a heat-conducting sheet. The heat-conducting sheet of Example 3 had a first and second heat-conducting layer formed from samples 3 and 1 respectively, and each having thickness of 0.2 mm. The first and second heat-conducting layers were adhered together via an interface having a thickness of 9.8 μm. When a cross-section of the heat-conducting sheet of Example 3 was observed, there were few graphitized carbon fibers present in the interface, and no bubbles were present in the interface. Further, the filling ratio of the aluminum oxide powder in the interface was 114% with respect to the filling ratio of the aluminum oxide powder in the first and second heat-conducting layers. In addition, the surface on the first heat-conducting layer side of the heat-conducting sheet had a friction coefficient of less than 0.25, and was a non-pressure-sensitive adhesive surface, and the surface on the second heat-conducting layer side of the heat-conducting sheet had a friction coefficient of 0.5 or more, and was a pressure-sensitive adhesive surface. Table 1 shows the other evaluation results of the heat-conducting sheet.

Example 4

The sheet-shaped sample 1 and sample 4 were provided, stacked, and then adhered together by pressing in the same manner as Example 1 to obtain a heat-conducting sheet. The heat-conducting sheet of Example 4 had a first and second heat-conducting layers formed from samples 4 and 1 respectively, and each having thickness of 0.2 mm. The first and second heat-conducting layers were adhered together via an interface having a thickness of 9.5 μm. When a cross-section of the heat-conducting sheet of Example 4 was observed, there were few graphitized carbon fibers present in the interface, and 0% bubbles present in the interface. Further, the filling ratio of the aluminum oxide powder in the interface was 112% with respect to the filling ratio of the aluminum oxide powder in the first and second heat-conducting layers. In addition, the surface on the first heat-conducting layer side of the heat-conducting sheet had a friction coefficient of less than 0.25, and was a non-pressure-sensitive adhesive surface, and the surface on the second heat-conducting layer side of the heat-conducting sheet had a friction coefficient of 0.5 or more, and was a pressure-sensitive adhesive surface. Table 1 shows the other evaluation results of the heat-conducting sheet.

Comparative Examples 1 to 4

In each of Comparative Examples 1 to 4, a single-layer heat-conducting sheet was prepared in the same manner as for samples 1 to 4, except that the thickness was other than 0.4 mm. The evaluation results of the heat-conducting sheets are shown in Tables 1 and 2.

Comparative Example 5

Two sheets of the sheet-shaped samples 2 were provided, stacked, and pressed under the same conditions as in Example 1, but the two samples 2 did not adhere to each other, and a heat-conducting sheet was not obtained.

Comparative Example 6

Two sheets of the sheet-shaped samples 2 were provided, then stacked by interposing a pressure-sensitive adhesive double coated tape having a thickness of 10 μm ("No. 5601" manufactured by Nitto Denko Corporation), and pressed under the same conditions as in Example 1 to adhere the samples together, thereby obtaining a heat-conducting sheet.

The heat-conducting sheet of Comparative Example 6 had a first heat-conducting layer and a second heat-conducting layer formed from samples 2 and 2, respectively, and those heat-conducting layers were adhered by a pressure-sensitive adhesive double coated tape. Further, many bubbles were seen between the first heat-conducting layer and the second heat-conducting layer. Moreover, the friction coefficient of both surfaces of the heat-conducting sheet was less than 0.25, and those surfaces were a non-pressure-sensitive adhesive surface. Table 2 shows the other evaluation results of the heat-conducting sheet.

Comparative Example 7

A single-layer heat-conducting sheet having a polyethylene terephthalate (PET) film fixed to one surface of the heat-conducting layer was obtained in the production method of Comparative Example 1, except that one of the release films arranged in the mold was changed to a PET film having a thickness of 6 μm. Table 2 shows the evaluation results of the heat-conducting sheet.

TABLE 1

|  | Example 1 | Example 2 | Example 3 | Example 4 | Comparative Example 1 | Comparative Example 2 |
|---|---|---|---|---|---|---|
| First heat-conducting layer | sample 1 | sample 2 | sample 3 | sample 4 | sample 1 | sample 2 |
| Second heat-conducting layer | sample 1 | sample 1 | sample 1 | sample 1 |  |  |
| Layer structure | multi-layer | multi-layer | multi-layer | multi-layer | single-layer | single-layer |
| Surface roughness Ra (μm) of stacking surface | 0.37/0.37 | 8.1/0.37 | 3.8/0.37 | 4.0/0.37 | — | — |
| Pressure-sensitive adhesive properties | PSA/PSA | non-PSA/PSA | non-PSA/PSA | non-PSA/PSA | PSA/PSA | non-PSA/non-PSA |

TABLE 1-continued

|  | Example 1 | Example 2 | Example 3 | Example 4 | Comparative Example 1 | Comparative Example 2 |
| --- | --- | --- | --- | --- | --- | --- |
| Hardness | E50 | E50 | E50 | E60 | E50 | E50 |
| Thermal resistance (°C./W)[*1] | 0.52 | 0.58 | 0.49 | 0.54 | 0.51 | 0.46 |
| Volume resistivity (Ω·cm) | >1 × 10$^{10}$ | >1 × 10$^{10}$ | 6 × 10$^9$ | >1 × 10$^{10}$ | 5 × 10$^9$ | 3 × 10$^7$ |
| Interface thickness (μm) | 18 | 10 | 9.8 | 9.5 | — | — |
| Ratio (%) of intersecting anisotropic filler | 0 | 18 | 9.5 | 9.9 | — | — |
| Filling ratio (%) of non-anisotropic filler | 119 | 110 | 114 | 112 | — | — |
| Bubbles content ratio (%) | 0 | 2.1 | 0 | 0 | — | — |

[*1]Thermal resistance value when sample having thickness of 0.4 mm is compressed to 0.35 mm. Compression ratio is 12.5%.

TABLE 2

|  | Comparative Example 3 | Comparative Example 4 | Comparative Example 5 | Comparative Example 6 | Comparative Example 7 |
| --- | --- | --- | --- | --- | --- |
| First heat-conducting layer | sample 3 | sample 4 | sample 2 | sample 2 | resin film |
| Second heat-conducting layer |  |  | sample 2 | sample 2 | sample 1 |
| Layer structure | single-layer | single-layer | multi-layer | multi-layer[*2] | multi-layer |
| Surface roughness Ra (μm) of stacking surface | — | — | 8.1/8.1 | 8.1/8.1 | —/0.37 |
| Pressure-sensitive adhesive properties | non-PSA/non-PSA | non-PSA/non-PSA | Samples 2 did not adhere to each other | non-PSA/non-PSA | non-PSA/PSA |
| Hardness | E50 | E70 |  | E50 | E30 |
| Thermal resistance (° C./W)[*1] | 0.42 | 0.56 |  | 0.77 | 0.97 |
| Volume resistivity (Ω · cm) | 1 × 10$^6$ | 2 × 10$^6$ |  | >1 × 10$^{10}$ | >1 × 10$^{10}$ |
| Interface thickness (μm) | — | — |  | 10 *3 | — *5 |
| Ratio (%) of intersecting anisotropic filler | — | — |  | 35 | 0 |
| Filling ratio (%) of non-anisotropic filler | — | — |  | 76 *4 | — *5 |
| Bubbles content ratio (%) | — | — |  | 64 | 0 |

[*2]Adhesive layer present between layers.
*3 Thickness of adhesive layer taken as thickness of interface.
*4 Ratio of non-anisotropic filler at vicinity of interface decreased to 76% due to increase in bubbles.
*5 One of the layers did not contain anisotropic filler, and therefore was not measured.

As is clear from the results of Examples 1 to 4, by adhering the first and second heat-conducting layers together via the interface, good adhesion between the layers could be obtained while securing thermal conduction properties in the thickness direction even though the structure is a laminated structure. In contrast, as shown in Comparative Example 6, when the first and second heat-conducting layers were adhered together via an adhesive layer, thermal conduction properties in the thickness direction deteriorated, gaps were seen even in the interface, and the first and second heat-conducting layers could not be adhered with high adhesion.

Further, in Examples 1 to 4, the first and second sheets could be adhered with high adhesion by making the surface of the first sheet on which the skin layer was provided a stacking surface. In contrast, as shown in Comparative Example 5, when the stacking surface was not used as the skin layer, the first and second sheets did not adhere together even when stacked and pressed, and it was not possible to obtain a heat-conducting sheet that can be practically used. Further, in Examples 1 to 4, both thermal conduction properties and electrical insulation properties were good and well balanced, but in Comparative Examples 1 to 4 and 7 in which the heat-conducting layer was a single layer, it was not possible to achieve good thermal conduction properties and electrical insulation properties with a good balance.

REFERENCE SIGNS LIST 1, 11 heat-conducting sheet
1a, 11a first heat-conducting layer
1b, 11b second heat-conducting layer
1c, 1d, 11c, 11d surface
2 polymer matrix
3 anisotropic filler
3c lower end
3d upper end
4, 14 non-anisotropic filler
5, 15 interface
21 heat insulating material
22 lower copper block
23 upper copper block
24 heater
25 heat sink
26 load cell
S test piece
$\theta_{j0}$ temperature of upper copper block
$\theta_{j1}$ temperature of lower copper block

The invention claimed is:
1. A heat-conducting sheet comprising a first heat-conducting layer, a second heat-conducting layer, an interface, a polymer matrix, an anisotropic filler and a non-anisotropic filler, wherein:

the first and second heat-conducting layers each comprise the polymer matrix, the anisotropic filler and the non-anisotropic filler, the anisotropic filler oriented in a thickness direction, the first and second heat-conducting layers are laminated via the interface, the interface comprises the polymer matrix and the non-anisotropic filler, a filling ratio of the anisotropic filler in the interface is lower than that in the first and second heat-conducting layers, the anisotropic filler has electrical conductivity, a filling ratio of the non-anisotropic filler in the interface is higher than that in the first and second heat-conducting layers, and the non-anisotropic filler has electrical insulation properties, and wherein, when a 400 µm line perpendicular to the thickness direction is drawn in the interface in a cross-section, then a ratio of a length of overlapping bubbles on the 400 µm line with respect to a total length of the 400 µm line is less than 20%.

2. The heat-conducting sheet according to claim 1, wherein the anisotropic filler is graphitized carbon fiber.

3. The heat-conducting sheet according to claim 1, wherein an end portion on a second heat-conducting layer side of the anisotropic filler contained in the first heat-conducting layer and an end portion on a first heat-conducting layer side of the anisotropic filler contained in the second heat-conducting layer face each other, and the anisotropic filler contained in the first heat-conducting layer and the anisotropic filler contained in the second heat-conducting layer do not substantially intersect with each other.

4. The heat-conducting sheet according to claim 1, wherein on a surface on a first heat-conducting layer side of the heat-conducting sheet, the anisotropic filler protrudes from the polymer matrix, and on a surface on a second heat-conducting layer side of the heat-conducting sheet, the anisotropic filler does not protrude from the polymer matrix.

5. The heat-conducting sheet according to claim 4, wherein the surface on the first heat-conducting layer side of the heat-conducting sheet has a lower friction coefficient than the surface on the second heat-conducting layer side of the heat-conducting sheet.

6. The heat-conducting sheet according to claim 5, wherein the surface on the first heat-conducting layer side of the heat-conducting sheet has a friction coefficient of less than 0.3, and the surface on the second heat-conducting layer side of the heat-conducting sheet has a friction coefficient of 0.3 or more.

7. The heat-conducting sheet according to claim 1, wherein the interface has a thickness of 60 µm or less.

8. A method for producing the heat-conducting sheet according to claim 1, comprising:

providing the first layer and the second layer each comprising the polymer matrix, the anisotropic filler, and the non-anisotropic filler, the anisotropic filler oriented in the thickness direction therein; and laminating the first and second layers so that one surface of the first layer and one surface of the second layer are in contact with each other at the interface to obtain the heat-conducting sheet, wherein at least the one surface of the second layer is formed from a skin layer in which a filling ratio of the anisotropic filler is smaller than that in other portions of the second layer, the anisotropic filler has electrical conductivity, the filling ratio of the non-anisotropic filler in the interface is higher than that in the first and second heat-conducting layers, and the non-anisotropic filler has electrical insulation properties.

9. The method for producing the heat-conducting sheet according to claim 8, wherein the one surface of the second layer has pressure-sensitive adhesive properties.

10. The method for producing the heat-conducting sheet according to claim 8, wherein at least one of the one surface of the first layer and the one surface of the second layer has a surface roughness Ra of 4 µm or less.

11. The method for producing the heat-conducting sheet according to claim 10, wherein the one surface of the first layer has the anisotropic filler protruding from the polymer matrix and a surface roughness Ra of 4 µm or less.

12. The heat-conducting sheet according to claim 1, wherein a ratio of the filling ratio of the non-anisotropic filler in the interface to a filling ratio of the non-anisotropic filler in the first and second heat-conducting layers is greater than 100% and 200% or less.

13. The heat-conducting sheet according to claim 1, wherein the polymer matrix in the first heat-conducting layer, the polymer matrix in the second heat-conducting layer, and the interface are each a silicone rubber.

14. The heat-conducting sheet according to claim 1, wherein the interface further comprises the anisotropic filler oriented in the thickness direction.

15. A heat-conducting sheet comprising a first heat-conducting layer, a second heat-conducting layer, an interface, a polymer matrix, an anisotropic filler and a non-anisotropic filler, wherein:

the first and second heat-conducting layers each comprise the polymer matrix, the anisotropic filler and the non-anisotropic filler, the anisotropic filler oriented in a thickness direction, the first and second heat-conducting layers are laminated via the interface, the interface comprises the polymer matrix and the non-anisotropic filler, a filling ratio of the anisotropic filler in the interface is lower than that in the first and second heat-conducting layers, and a ratio of a filling ratio of the non-anisotropic filler in the interface to a filling ratio of the non-anisotropic filler in the first and second heat-conducting layers is greater than 100% and 200% or less, and wherein, when a 400 µm line perpendicular to the thickness direction is drawn in the interface in a cross-section, then a ratio of a length of overlapping bubbles on the 400 µm line with respect to a total length of the 400 µm line is less than 20%.

16. The heat-conducting sheet according to claim 15, wherein the anisotropic filler is graphitized carbon fiber.

17. The heat-conducting sheet according to claim 15, wherein an end portion on a second heat-conducting layer side of the anisotropic filler contained in the first heat-conducting layer and an end portion on a first heat-conducting layer side of the anisotropic filler contained in the second heat-conducting layer face each other, and the anisotropic filler contained in the first heat-conducting layer and the anisotropic filler contained in the second heat-conducting layer do not substantially intersect with each other.

18. The heat-conducting sheet according to claim 15, wherein on a surface on a first heat-conducting layer side of the heat-conducting sheet, the anisotropic filler protrudes from the polymer matrix, and on a surface on a second heat-conducting layer side of the heat-conducting sheet, the anisotropic filler does not protrude from the polymer matrix.

19. The heat-conducting sheet according to claim 18, wherein the surface on the first heat-conducting layer side of the heat-conducting sheet has a lower friction coefficient than the surface on the second heat-conducting layer side of the heat-conducting sheet.

20. The heat-conducting sheet according to claim 19, wherein the surface on the first heat-conducting layer side of the heat-conducting sheet has a friction coefficient of less than 0.3, and the surface on the second heat-conducting layer side of the heat-conducting sheet has a friction coefficient of 0.3 or more.

21. The heat-conducting sheet according to claim 15, wherein the interface has a thickness of 60 μm or less.

22. A method for producing the heat-conducting sheet according to claim 15, comprising:

providing the first layer and the second layer each comprising the polymer matrix, the anisotropic filler, and the non-anisotropic filler, the anisotropic filler oriented in the thickness direction therein; and laminating the first and second layers so that one surface of the first layer and one surface of the second layer are in contact with each other at the interface to obtain the heat-conducting sheet, wherein at least the one surface of the second layer is formed from a skin layer in which a filling ratio of the anisotropic filler is smaller than that in other portions of the second sheet, layer, and the ratio of the filling ratio of the non-anisotropic filler in the interface to the filling ratio of the non-anisotropic filler in the first and second heat-conducting layers is greater than 100% and 200% or less.

\* \* \* \* \*